(12) United States Patent  (10) Patent No.: US 9,165,611 B2
Yun et al.  (45) Date of Patent: *Oct. 20, 2015

(54) WIRING STRUCTURES FOR THREE-DIMENSIONAL SEMICONDUCTOR DEVICES

(71) Applicant: Samsung Electronics Co., Ltd., Suwon-si, Gyeonggi-do (KR)

(72) Inventors: Jang-Gn Yun, Hwaseong-si (KR); Hong-Soo Kim, Seongnam-si (KR); Hoo-Sung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/157,830

(22) Filed: Jan. 17, 2014

(65) Prior Publication Data

US 2014/0203442 A1  Jul. 24, 2014

(30) Foreign Application Priority Data

Jan. 18, 2013 (KR) .................. 10-2013-0005726

(51) Int. Cl.
*H01L 23/48* (2006.01)
*G11C 5/06* (2006.01)
*H01L 27/105* (2006.01)
*H01L 27/115* (2006.01)
*H01L 27/06* (2006.01)

(52) U.S. Cl.
CPC .......... *G11C 5/063* (2013.01); *H01L 27/11548* (2013.01); *H01L 27/11575* (2013.01); *H01L 27/0688* (2013.01); *H01L 27/1052* (2013.01); *H01L 27/115* (2013.01); *H01L 27/11521* (2013.01); *H01L 27/11556* (2013.01); *H01L 27/11582* (2013.01)

(58) Field of Classification Search
CPC ............ H01L 27/115; H01L 27/11521; H01L 27/1052
USPC .......................................... 257/773
See application file for complete search history.

(56) References Cited

U.S. PATENT DOCUMENTS

| 7,910,973 | B2 | 3/2011 | Sakaguchi et al. |
| 8,068,364 | B2 | 11/2011 | Maejima |
| 8,084,809 | B2 | 12/2011 | Maeda et al. |
| 8,107,289 | B2 | 1/2012 | Shim et al. |
| 8,456,909 | B2 | 6/2013 | Lee et al. |
| 2009/0267128 | A1* | 10/2009 | Maejima ...................... 257/314 |

(Continued)

FOREIGN PATENT DOCUMENTS

| KR | 1020110015337 | 2/2011 |
| KR | 101113766 | 2/2012 |
| KR | 1020120026273 | 3/2012 |

*Primary Examiner* — Nicholas Tobergte
(74) *Attorney, Agent, or Firm* — Myers Bigel Sibley & Sajovec, P.A.

(57) ABSTRACT

Wiring structures of three-dimensional semiconductor devices and methods of forming the same are provided. The wiring structures may include an upper wordline and a lower wordline, each of which extends in a longitudinal direction. The upper wordline may include a recessed portion that extends for only a portion of the upper wordline in a transverse direction and the lower wordline may include a wiring area exposed by the recessed portion of the upper wordline. The wiring structures may also include an upper contact plug contacting the upper wordline and a lower contact plug contacting the wiring area. The upper and lower contact plugs may extend in a vertical direction.

20 Claims, 18 Drawing Sheets

(56) References Cited

U.S. PATENT DOCUMENTS

| | | |
|---|---|---|
| 2009/0310415 A1 | 12/2009 | Jin et al. |
| 2010/0090286 A1* | 4/2010 | Lee et al. ............... 257/368 |
| 2010/0155826 A1 | 6/2010 | Wenxu et al. |
| 2010/0193861 A1* | 8/2010 | Shim et al. ............... 257/329 |
| 2011/0018036 A1 | 1/2011 | Hwang et al. |
| 2011/0151667 A1* | 6/2011 | Hwang et al. ............... 438/667 |
| 2012/0052674 A1* | 3/2012 | Lee et al. ............... 438/591 |
| 2012/0187471 A1* | 7/2012 | Yu et al. ............... 257/324 |
| 2012/0238093 A1* | 9/2012 | Park et al. ............... 438/675 |
| 2013/0044531 A1* | 2/2013 | Baek et al. ............... 365/72 |
| 2013/0270714 A1* | 10/2013 | Lee et al. ............... 257/774 |
| 2014/0057429 A1* | 2/2014 | Oh et al. ............... 438/613 |
| 2014/0197546 A1* | 7/2014 | Hwang et al. ............... 257/774 |

* cited by examiner

WIRING STRUCTURES FOR THREE-DIMENSIONAL SEMICONDUCTOR DEVICES

CROSS-REFERENCE TO RELATED APPLICATION

This U.S. non-provisional patent application claims priority under 35 U.S.C §119 to Korean Patent Application No. 10-2013-0005726, filed on Jan. 18, 2013, in the Korean Intellectual Property Office, the disclosure of which is hereby incorporated by reference in its entirety.

FIELD

The present disclosure generally relates to the field of electronics and, more particularly, to semiconductor devices.

BACKGROUND

Recently, three-dimensional semiconductor devices have been developed to manufacture highly integrated devices. Since three-dimensional semiconductor devices may have a stacked structure of memory cells in a vertical direction, electric signals may be applied to each of the cells stacked in the vertical direction. Therefore, three-dimensional semiconductor devices may have a complicated wiring structure.

SUMMARY

A wiring structure may include a first structure including first step layers. Each of the first step layers may include a first word line and a second word line stacked on the first word line in a first direction and may extend in a second direction, the first step layers may be spaced apart from each other in the first direction, the first direction may be substantially perpendicular to an upper surface of a substrate, the second direction may be substantially parallel to the upper surface of the substrate, and each of the second word lines may include a first dent at an end portion thereof in the second direction. The wiring structure may also include a second structure including second step layers and being disposed adjacent to the first structure in a third direction. Each of the second step layers may include a third word line and a fourth word line stacked on the third word line in the first direction and may extend in the second direction, the second step layers may be spaced apart from each other in the first direction, the third direction may be substantially parallel to the upper surface of the substrate and may be substantially perpendicular to the second direction, each of the fourth word lines may include a second dent at an end portion thereof in the second direction, and each of the second dents may be a mirror image of one of the first dents about an axis extending between the first and second structures. The wiring structure may further include first contact plugs contacting respective upper surfaces of the first wordlines exposed by the first dents and respective upper surfaces of the third word lines exposed by the second dents, second contact plugs contacting respective upper surfaces of the second and fourth word lines, a first connecting pattern connecting immediately adjacent ones of the first contact plugs, which are arranged along the third direction, a first wiring line extending in the third direction, and a second wiring line extending in the third direction. The first wiring line may be spaced apart from the first contact plugs and may be electrically connected to the first connecting pattern. The second wiring line may be spaced apart from the second contact plugs and may be electrically connected to at least one of the second contact plugs.

In various embodiments, each of the first and second step layers may be stacked in the first direction at a plurality of heights from the upper surface of the substrate and a length of each of the first and second step layers in the second direction may decrease as a height of the each of the first and second first step layers increases.

According to various embodiments, the first wiring line may be electrically connected with ones of the first contact plugs contacting the first and third wordlines, which are at a first height from the upper surface of the substrate. The second wiring line may be electrically connected with ones of the second contact plugs contacting the second and fourth wordlines, which are at a second height from the upper surface of the substrate.

According to various embodiments, ones of the first contact plugs contacting the first and third wordlines, which are at a first height from the upper surface of the substrate, may be disposed along the third direction and ones of the second contact plugs contacting the second and fourth wordlines, which are at a second height from the upper surface of the substrate, may be disposed along the third direction.

In various embodiments, the first structure may be one of first structures and the second structure may be one of second structures and the first and second structures may be arranged in an alternating sequence in the third direction.

In various embodiments, the wiring structure may additionally include a first pad pattern connecting the first connecting pattern to the first wiring line.

According to various embodiments, ones of the first contact plugs contacting the first and third wordlines, which are at a first height from the upper surface of the substrate, may be disposed along the third direction and ones of the second contact plugs contacting the second and fourth wordlines, which are at a second height from the upper surface of the substrate, may be disposed along the third direction.

According to various embodiments, the first and the second contact plugs may contact respective first and second pad regions, the first pad regions may be adjacent respective end portions of the first and third word lines in the second direction and the second pad regions may be adjacent respective end portions of the second and fourth word lines in the second direction. In various embodiments, the first and the second contact plugs may contact central portions of respective the first and second pad regions.

In various embodiments, some of the first and second contact plugs may be disposed between the first and second wiring lines.

A vertical integrated circuit device may include an upper wordline extending in a longitudinal direction and the upper wordline may include a recessed portion that extends for only a portion of the upper wordline in a transverse direction that is substantially perpendicular to the longitudinal direction. The vertical integrated circuit device may also include a lower wordline extending in the longitudinal direction. The upper and lower wordlines may be at least partially stacked in a vertical direction that is substantially perpendicular to both the longitudinal direction and the transverse direction and the lower wordline may include a wiring area exposed by the recessed portion of the upper wordline. The vertical integrated circuit device may further include an upper contact plug contacting the upper wordline and extending in the vertical direction and a lower contact plug contacting the wiring area and extending in the vertical direction.

A vertical integrated circuit device may include a first stack including a first upper wordline and a first lower wordline, which are stacked in a vertical direction. The first upper wordline and the first lower wordline each may extend in a longitudinal direction that is substantially perpendicular to the vertical direction. The vertical integrated circuit device may also include a second stack including a second upper wordline and a second lower wordline, which are stacked in the vertical direction. The second upper wordline and the second lower wordline each may extend in the longitudinal direction and the second stack may be spaced apart from the first stack in a transverse direction that is substantially perpendicular to both the longitudinal direction and the vertical direction. The vertical integrated circuit device may further include first and second upper contact plugs contacting the first upper wordline and the second upper wordline respectively and first and second lower contact plugs contacting the first lower wordline and the second lower wordline respectively. The first and second upper contact plugs and the first and second lower contact plugs may be transversely aligned.

An integrated circuit device may include a first stack including a first conductive line extending in a longitudinal direction and the first conductive line may include a first recessed portion that extends for only a portion of the first conductive line in a transverse direction that is substantially perpendicular to the longitudinal direction. The integrated circuit device may also include a second stack including a second conductive line extending in the longitudinal direction. The second stack may be spaced apart from the first stack in the transverse direction, the first and second conductive lines may be at a substantially equal level in a vertical direction that is substantially perpendicular to both the longitudinal direction and the transverse direction, and the second conductive line may include a second recessed portion that may extend for only a portion of the second conductive line in the transverse direction and may be a mirror image of the first recessed portion about an axis extending between the first stack and the second stack.

DETAILED DESCRIPTION

Figure 1:
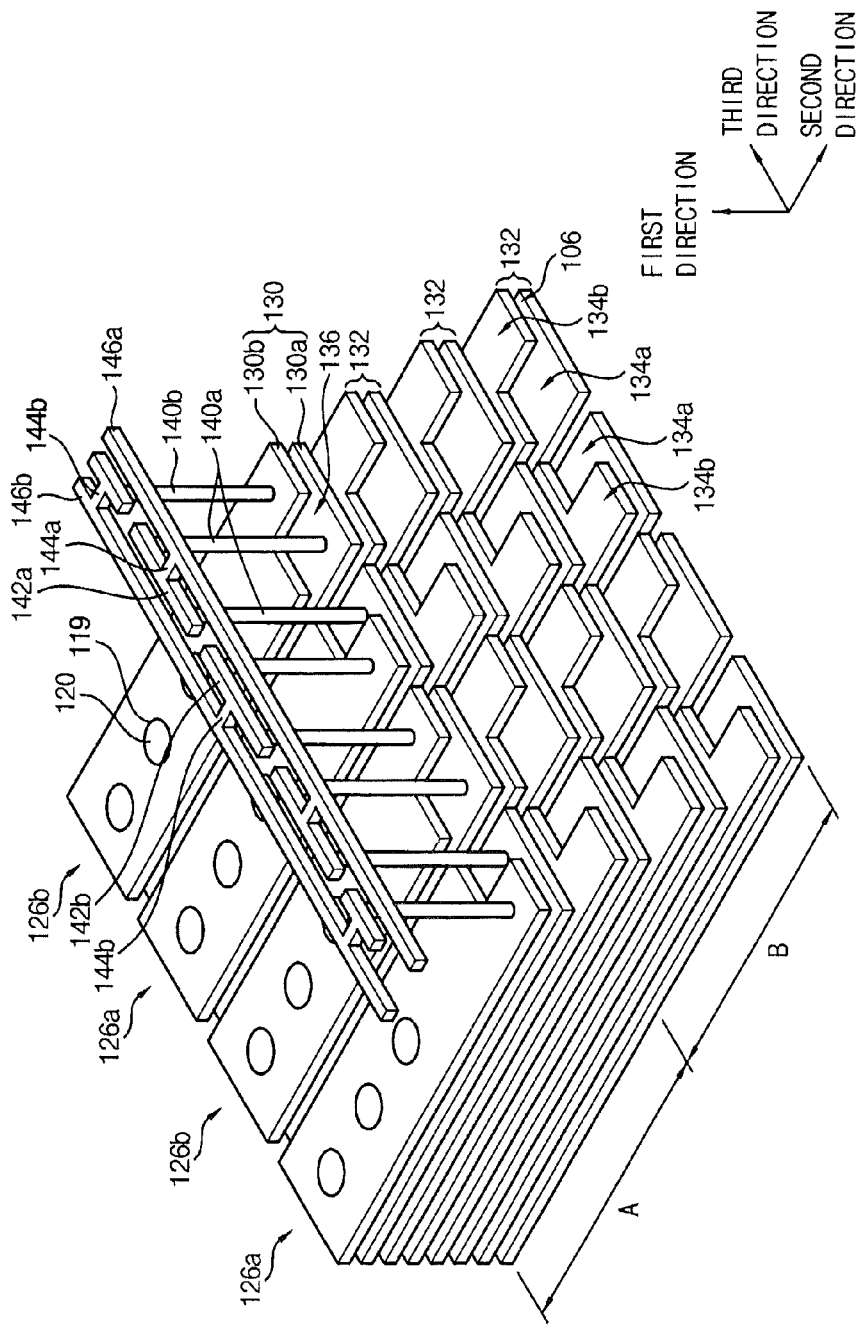
FIG. 1 is a perspective view illustrating a three-dimensional semiconductor device including wiring structures according to example embodiments of the present inventive concept.

Various example embodiments will be described below with reference to the accompanying drawings. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to perspective and plan view drawings that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, example embodiments will be described in detail with reference to the accompanying drawings.

Figure 2:
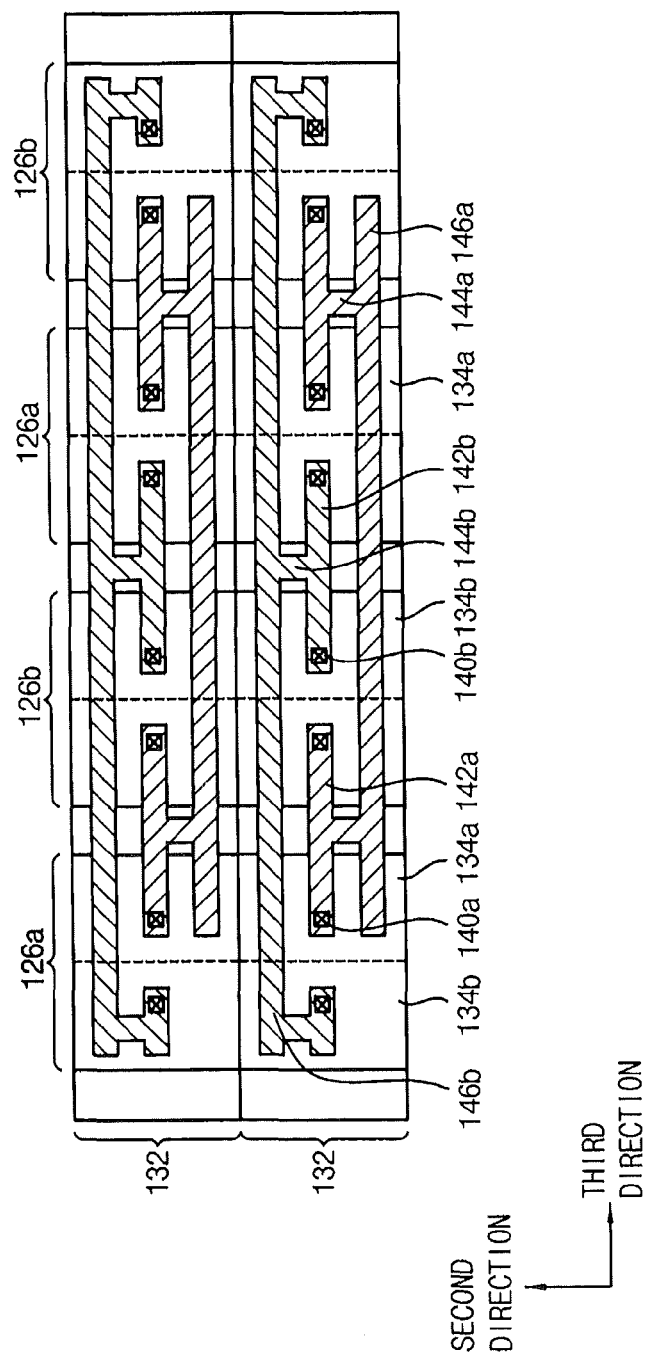
FIG. 2 is a plan view of a portion of the three-dimensional semiconductor device in FIG. 1.
Figure 3:
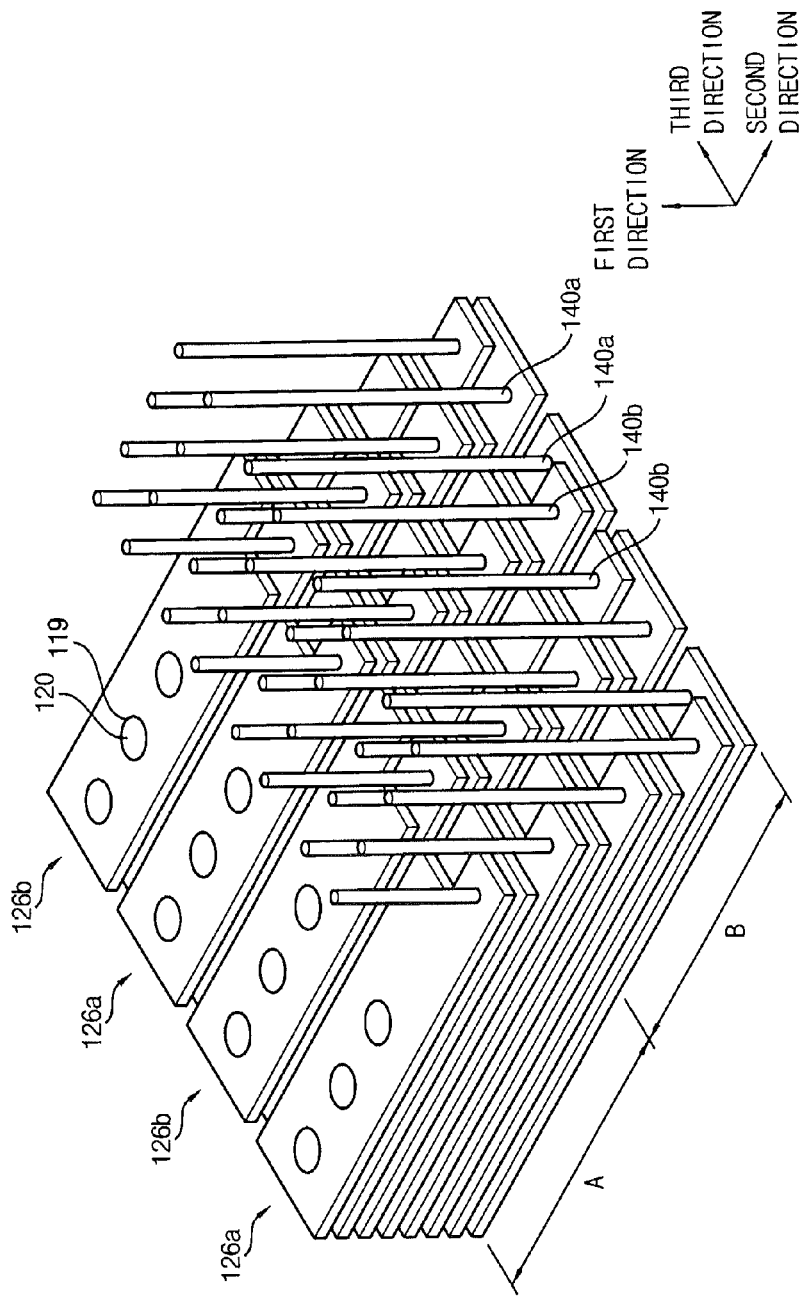
FIG. 3 is a perspective view illustrating a portion of the three-dimensional semiconductor device in FIG. 1.

FIG. 1 is a perspective view illustrating a three-dimensional semiconductor device including wiring structures according to example embodiments of the present inventive concept. FIG. 2 is a plan view of a portion of the three-dimensional semiconductor device in FIG. 1. FIG. 3 is a perspective view illustrating a portion of the three-dimensional semiconductor device in FIG. 1.

In all figures in this specification, a direction substantially vertical to an upper surface of a substrate is referred to as a first direction, and two directions substantially parallel to the upper surface of the substrate and substantially perpendicular to each other are referred to as a second direction and a third direction. Additionally, a direction indicated by an arrow in figures and a reverse direction thereto are considered as the same direction. The definition of the direction may be the same in all figures. The first direction may be a vertical direction, the second direction may be a longitudinal direction, and the third direction may be a transverse direction.

Referring to FIGS. 1 to 3, the three-dimensional semiconductor device may have a first region A for forming memory cells and a second region B for forming wirings that connect to the memory cells. The second region B may be located adjacent one side or both sides of the first region A in the second direction. The wirings are positioned in at least one portion of the second regions B.

A plurality of pillar structures 120, each of which may extend in the first direction, may be formed in the first region A on the substrate. The bottom surface of the pillar structures 120 may contact the upper surface of the substrate. Each pillar structure 120 may include a channel pattern, and a tunnel insulation layer pattern, a charge storing layer pattern and a first blocking layer pattern that are sequentially stacked on an outer sidewall of the channel pattern.

In example embodiments, the channel pattern may have a hollow cylindrical shape, however, a bottom of the hollow cylindrical-shaped channel pattern may not be opened. An inner space defined by the hollow cylindrical-shaped channel pattern may be filled with an insulating material. However, the shape of the channel pattern may not be limited thereto. A pad insulating layer may be formed on the substrate.

A plurality of word lines 130a and 130b may be formed on the pad insulating layer, and may be spaced apart from each other in the first direction. A plurality of insulation layers may be formed between the word lines 130a and 130b, and thus the word lines 130a and 130b may be sequentially stacked in the first direction and may be electrically insulated from each other. Therefore, the word lines 130a and 130b and the insulation layers may be alternately and repeatedly stacked on the pad insulating layer in the first direction. In FIG. 1, the insulation layers and the substrate are not shown to simplify the figures for the convenience of simplicity.

Each of the word lines 130a and 130b may extend in the second direction, and may surround the outer sidewall of the pillar structures 120. That is, the pillar structures 120 may penetrate through the word lines 130a and 130b. The word lines 130a and 130b may contact the first blocking layer patterns of the pillar structures 120. The word lines 130a and 130b may extend in the second direction from the first region A to the second region B. The word lines 130a and 130b may include a conductive material. Examples of the conductive material may include a metal element, a conductive semiconductor material, a conductive metal nitride, etc.

A stacked structure of the word lines 130a and 130b and the insulation layers may be referred to as a word line structure 126a and 126b. In example embodiments, a plurality of word line structures 126a and 126b may be repeatedly disposed in the third direction. The word line structures 126a and 126b may include first word line structures 126a and second word lines structures 126b, which may be disposed alternately in the third direction.

Each of the word lines 130a and 130b in the first region A may serve as a control gate of a cell transistor or a gate of a selective transistor. Each of the word lines 130a and 130b in the second region B may serve as a pad region for mounting contact plugs. Hereinafter, an end portion of each of the word lines 130a and 130b in the second direction, i.e., a portion of each of the word lines 130a and 130b in the second region B is referred to as a pad structure.

The pad structure may have a step shape and may include a plurality of step layers 132. The step layers 132 may be stacked in the first direction from the upper surface of the substrate. A lower one of the step layers 132 may extend in the second direction and may have a length greater than a length of an upper one of the step layers 132 extending in the second direction. That is, a length of each step layer 132 in the second direction may decrease as the distance of the step layer 132 from the upper surface of the substrate increases.

At least one of the step layers 132 in the pad structure may include a pair of word lines 130a and 130b sequentially stacked in the first direction and one of the insulation layers interposed therebetween.

Hereinafter, in each of the step layers 132, a lower one of the word lines 130a and 130b is referred to as a first word line 130a, and an upper one of the word lines 130a and 130b is referred to as a second word line 130b. When the semiconductor device includes eight word lines 130a and 130b in a word line structure 126a or 126b, it may have four step layers 132 in that word line structure 126a or 126b.

In example embodiments, a second end portion of each second word line 130b in the second region B may include a recessed portion of "dent" 136, which may be formed at a lateral portion of the end portion thereof. Thus, a first end portion of each first word line 130a may not completely overlap with the second end portion of each second word line 130b and may be exposed by the dent 136 at the second end portion of each second word line 130b.

In example embodiments, the dents 136 in the first and second word line structures 126a and 126b may be mirror images of each other about an axis extending in the second direction. Thus, the first and second word line structures 126a and 126b may have a symmetrical shape relative to each other about the axis extending in the second direction.

The second end portion of each second word line 130b may serve as a second pad region 134b, and a portion of the first end portion of each first word line 130a that is not covered by the second end portion of each second word line 130b, i.e., a portion of the first end portion of each first word line 130a under the dent 136 of each second word line 130b, may serve as a first pad region 134a. Each of the first and second pad regions 134a and 134b may have an upper surface area sufficient for forming a contact plug.

In FIG. 1, only one second region B is shown, and thus each of the pad regions 134a and 134b are formed only at one end portion of each of the first and second word lines 130a and 130b. However, when two second regions B are formed, each of the first and second pad regions 134a and 134b may be formed at both end portions of each of the first and second word lines 130a and 130b. An insulating interlayer may be formed to cover the first and second word line structures 126a and 126b. Wiring structures connecting each of the pad regions 134a and 134b may be provided in and/or on the insulating interlayer.

In order to simplify the figures, only one wiring structure connected to an uppermost step layer is illustrated, however, a plurality of wiring structures having the same or similar shape may be connected to other step layers.

The wiring structure may include first contact plugs 140a, second contact plugs 140b, first connecting patterns 142a, second connecting patterns 142b, a first wiring line 146a and a second wiring line 146b. The first contact plugs 140a may contact the first pad regions 134a, respectively, and the second contact plugs 140b may contact the second pad regions 134b, respectively.

As illustrated in FIGS. 2 and 3, the first contact plugs 140a and the second contact plugs 140b on the step layers at substantially the same height may be arranged in a straight line along the third direction. That means the first contact plugs 140a and the second contact plugs 140b may not be arranged in a zigzag pattern along the third direction. Thus, the first contact plugs 140a and the second contact plugs 140b may be disposed at central portions of the first pad regions 134a and the second pad regions 134b, respectively.

If the first contact plugs 140a and the second contact plugs 140b on the step layers substantially at the same height are arranged in a zigzag pattern, widths of the first and second pad regions 134a and 134b in the second direction may increase.

However, in example embodiments, the first contact plugs 140a and the second contact plugs 140b on the step layers at substantially the same height may be arranged on the central portions of the first pad regions 134a and the second pad regions 134b, respectively, and thus the width may be decreased.

A pair of first contact plugs 140a and a pair of second contact plugs 140b may be alternately and repeatedly disposed in the third direction on the step layers at substantially the same height. Therefore, the pair of first contact plugs 140a disposed adjacent each other may contact the first pad regions 134a, and the pair of second contact plugs 140b disposed adjacent each other may contact the second pad regions 134b.

Each of the first connecting patterns 142a may connect the pair of first contact plugs 140a on the step layers at substantially the same height. Each of the second connecting patterns 142b may connect the pair of the second contact plugs 140b on the step layers at substantially the same height. The first connecting patterns 142a and the second connecting patterns 142b may be alternately and repeatedly disposed in the third direction.

A plurality of first pad patterns 144a may contact sidewalls of the first connecting patterns 142a and the first wiring line 146a, that may extend in the third direction, to connect the first connecting patterns 142a with the first wiring line 146a.

A plurality of second pad patterns 144b may contact sidewalls of the second connecting patterns 142b and the second wiring line 146b, which may extend in the third direction, to connect the second connecting patterns 142b with the second wiring line 146b.

The first wiring line 146a and the second wiring line 146b may be arranged to be parallel to each other. The first pad patterns 144a, the second pad patterns 144b, the first connecting patterns 142a and the second connecting patterns 142b may be disposed between the first wiring line 146a and the second wiring line 146b.

A first upper contact and a first upper wiring may be further formed on the first wiring line 146a so as to contact the first wiring line 146a. The first upper wiring may extend in the second direction. In addition, a second upper contact and a second upper wiring may be formed on the second wiring line 146b so as to contact the second wiring line 146b. The second upper wiring may extend in the second direction. As described above, the semiconductor device may have a high integration degree due to the wiring structures.

FIGS. 4 to 10 are perspective views illustrating intermediate structures provided in operations of manufacturing a three-dimensional semiconductor device including wiring structures according to example embodiments of the present inventive concept.

Figure 4:
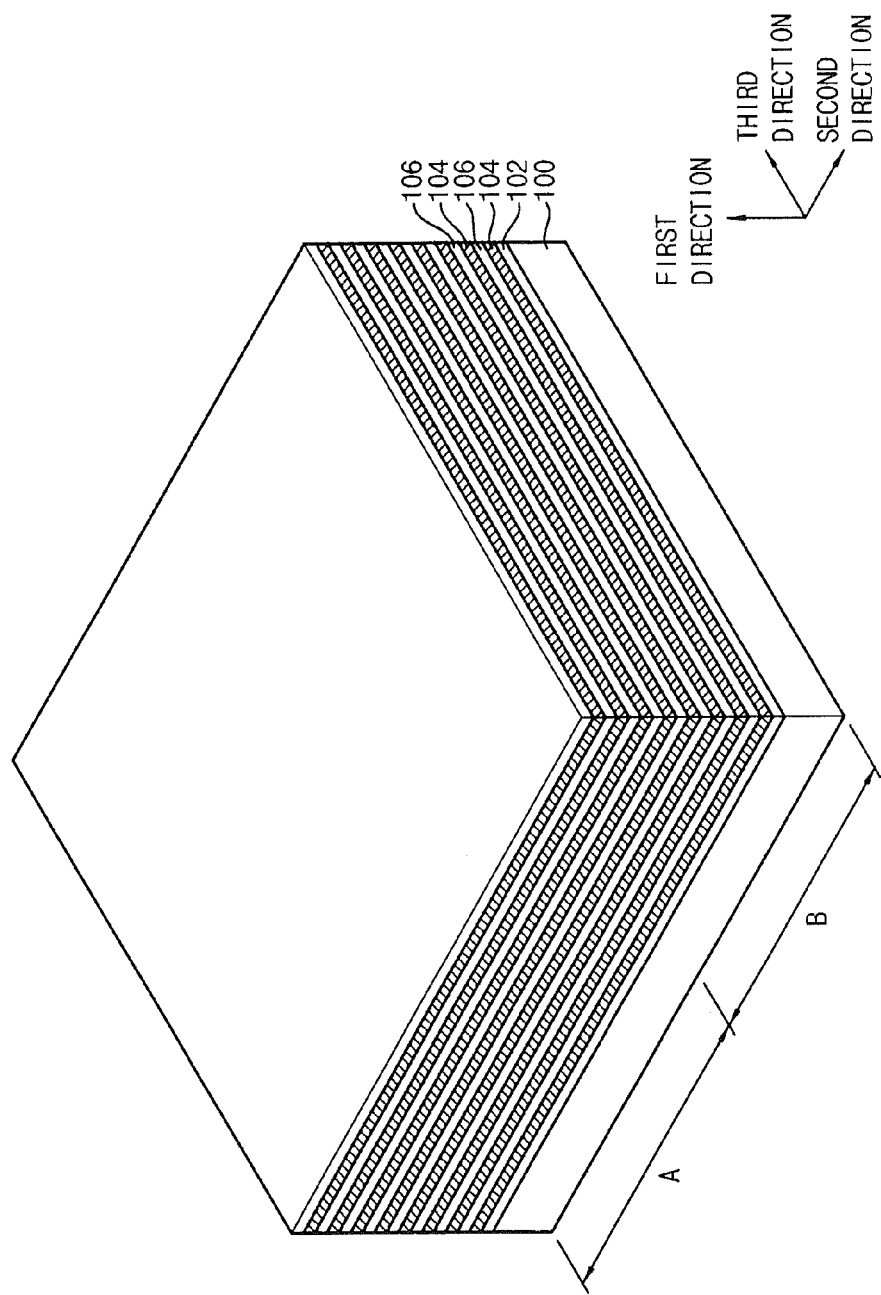
FIGS. 4 to 10 are perspective views illustrating intermediate structures provided in operations of manufacturing a three-dimensional semiconductor device including wiring structures according to example embodiments of the present inventive concept.

Referring to FIG. 4, a semiconductor substrate 100 including a first region A for forming memory cells and a second region B for forming wirings may be provided. In FIG. 4, only one second region B adjacent one side of the first region A in the second direction is shown, however, second regions B may be formed to be adjacent both sides of the first region A in the second region in other embodiments. The semiconductor substrate 100 may be, e.g., a single crystalline substrate.

A pad insulating layer 102 may be formed on the semiconductor substrate 100. Sacrificial layers 104 and insulation layers 106 may be alternately and repeatedly formed on the pad insulating layer 102. The insulation layers 106 may be formed to include, e.g., silicon oxide. The sacrificial layers 104 may be formed to include a material having an etching selectivity with respect to the insulation layers 106. For example, the sacrificial layers 104 may be formed to include silicon nitride.

A number of the sacrificial layers 104 stacked in the first direction may be the same as a number of all transistors, e.g., all of cell transistors and selective transistors, stacked in the first direction. Even though six sacrificial layers 104 are shown in FIG. 4, the number of insulation layers 106 and sacrificial layers 104 stacked in the first direction may not be limited thereto.

Figure 5:
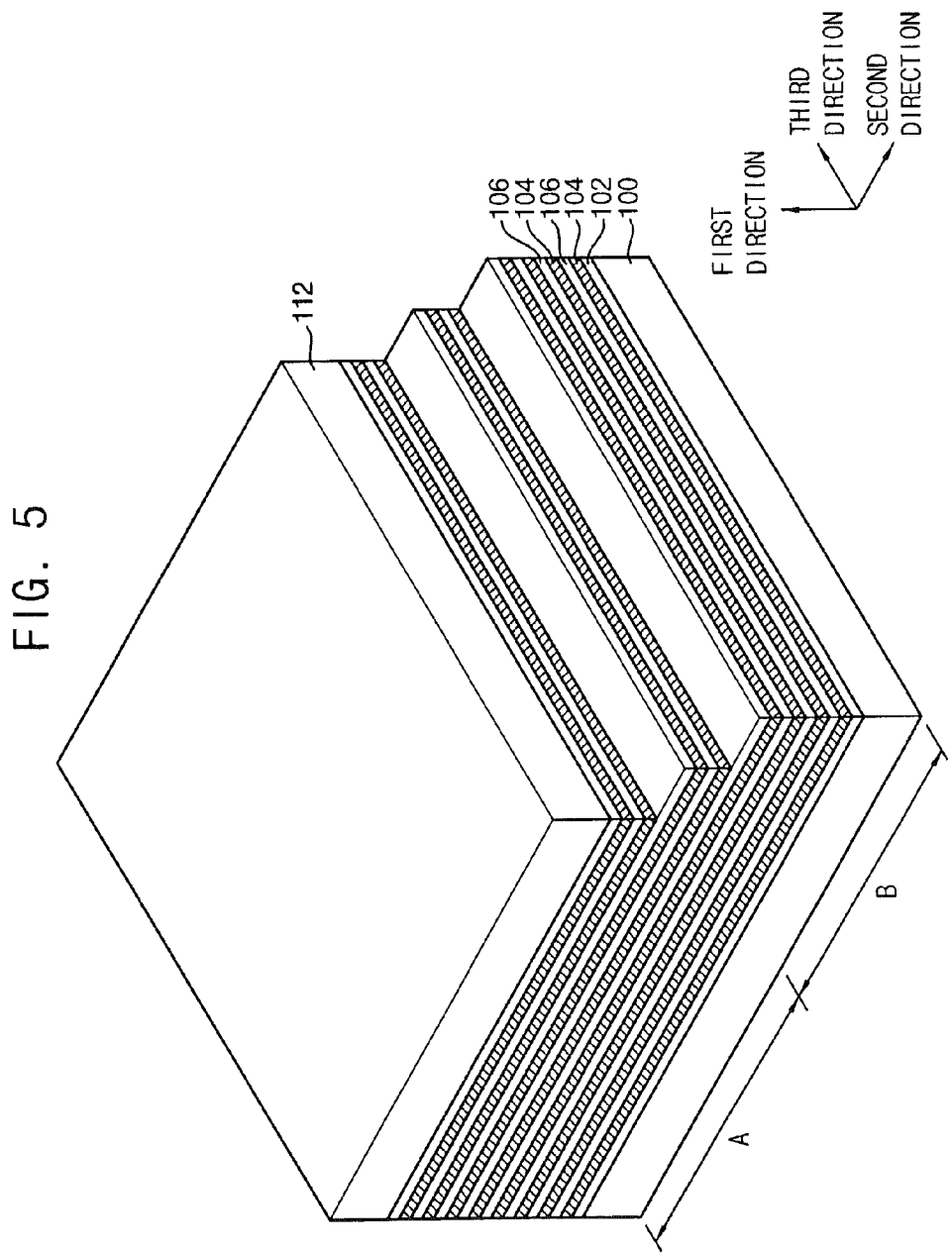
Figure 6:
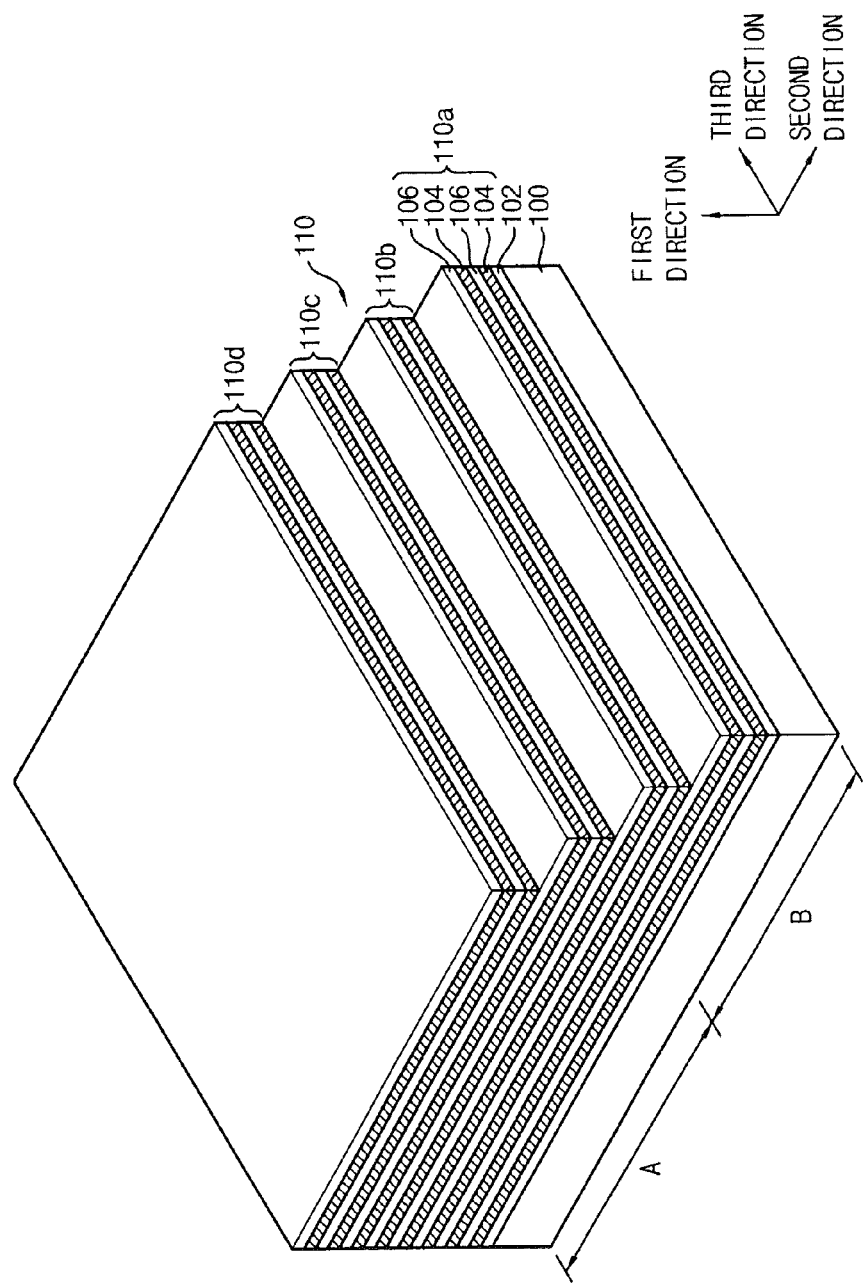

Referring to FIGS. 5 and 6, a first preliminary step structure 110 having a step shape at an end portion in the second direction, which is formed in the second region B by etching the insulation layers 106 and the sacrificial layers 104. The first preliminary step structure 110 may include a plurality of steps, for example, four steps 110a, 110b, 110c and 110d as shown in FIG. 6. Each of the steps 110a, 110b, 110c and 110d may include at least two sacrificial layers 104 therein, and the insulation layers 106 may be formed between the sacrificial layers 104.

As illustrated in FIGS. 5 and 6, an uppermost layer included in each of the steps 110a, 110b, 110c and 110d of the first preliminary step structure 110 may be one of the insulation layers 106. Alternatively, in example embodiments, an uppermost layer included in each of the steps 110a, 110b, 110c and 110d of the first preliminary step structure 110 may be one of the sacrificial layers 104.

In example embodiments, each of the steps 110a, 110b, 110c and 110d in the first preliminary step structure 110 may include two sacrificial layers 104 and two insulation layers 106 alternately stacked. Hereinafter, the steps 110a, 110b, 110c and 110d are referred to as first, second, third and fourth steps, respectively, in this order.

Hereinafter, a method of forming the first preliminary step structure 110 may be illustrated with reference to FIGS. 5 and 6.

Referring to FIG. 5, a first photoresist layer may be formed on an uppermost layer of the insulation layers 106, hereinafter "uppermost insulation layer". A first end portion of the first photoresist layer in the second direction, which may be located in the second region B, may be removed to form a first photoresist pattern exposing a first end portion of the uppermost insulation layer 106 in the second direction. The exposed first end portion of the uppermost insulation layer 106 and corresponding first end portions of two sacrificial layers 104 and one insulation layer 106 under the exposed first end portion of the uppermost insulation layer 106 may be etched using the first photoresist pattern as an etching mask.

A second end portion of the first photoresist pattern in the second direction, which may be also in the second region B, may be trimmed to form a second photoresist pattern 112 exposing a second end portion of the uppermost insulation layers 106. The exposed second end portion of the uppermost insulation layers 106 and corresponding second end portions of the two sacrificial layers 104 and one insulation layer 106 under the exposed second end portion of the uppermost insulation layers 106 may be etched using the second photoresist pattern 112 as an etching mask, and concurrently first end portions of other two insulation layers 106 and other two sacrificial layers 104, which have been under the first end portion of the uppermost insulation layer 106 and are exposed by the second photoresist pattern 112, may be etched.

Referring to FIG. 6, a process substantially the same as or similar to that illustrated with reference to FIG. 5 may be repeatedly performed using a third photoresist pattern, a fourth photoresist pattern, etc. to form a plurality of steps, e.g., four steps 110a, 110b, 110c and 110d, After forming the first preliminary step structure 110, the photoresist patterns may be removed.

As described above, a process for forming a photoresist pattern, a trimming process and an etching process may be employed to form each step of the first preliminary step structure 110. Therefore, the number of steps increases, the number of processes increases. However, in example embodiments, each of the steps 110a, 110b, 110c and 110d may include two sacrificial layers 104 therein, and thus a number of processes for forming the first preliminary step structure 110 may be half of a number of processes for forming a preliminary step structure including a plurality of steps, each of which has only one sacrificial layer therein. Therefore, according to example embodiments, the number of processes for forming the first preliminary structure 110 may decrease and thus the first preliminary structure 110 may be more readily formed.

Figure 7:
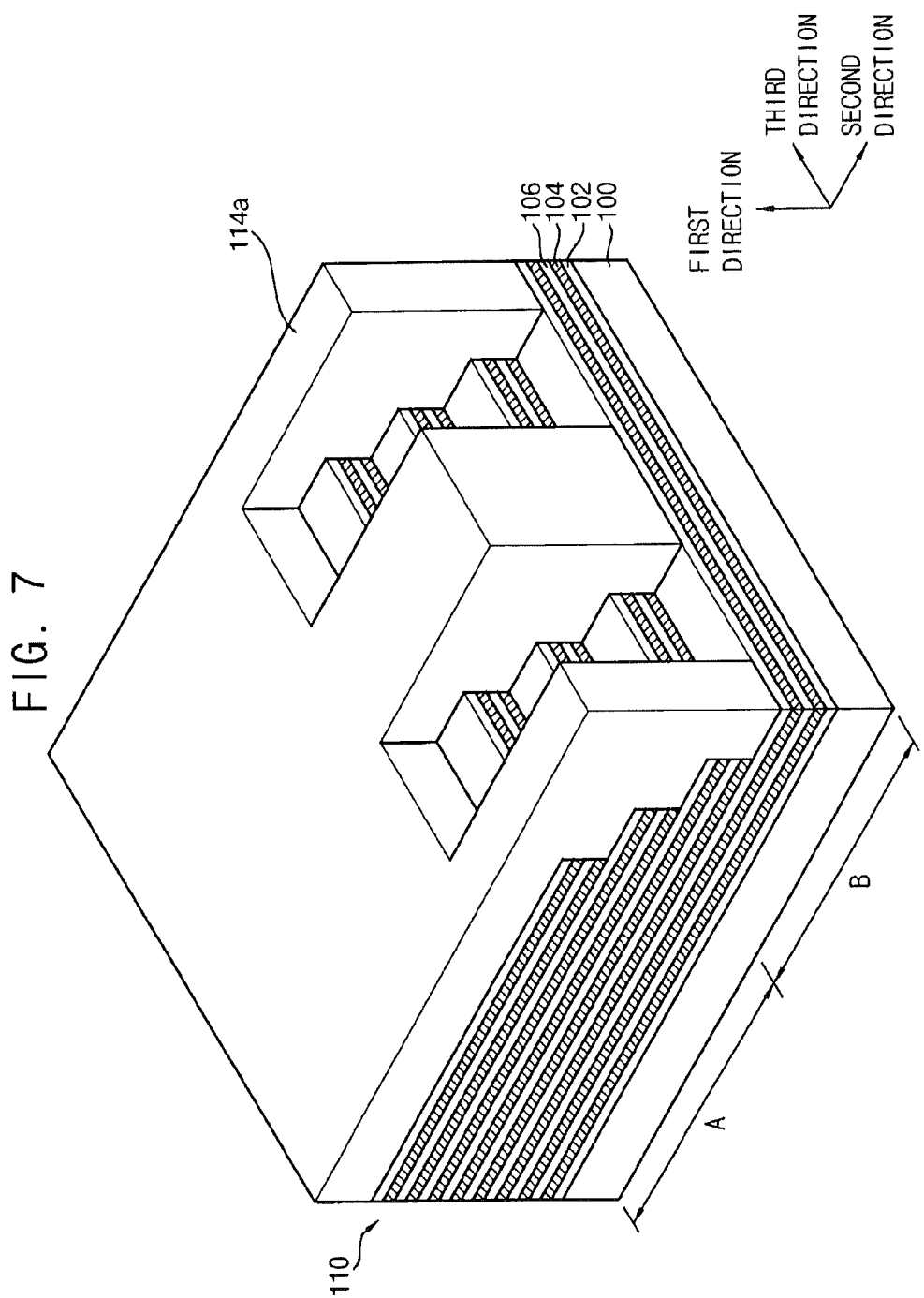

Referring to FIG. 7, an etching mask pattern 114a including a first portion, which may cover the first preliminary step structure 110 in the first region A, and a plurality of second portions, which may be connected to the first portion and partially cover the first preliminary step structure 110 in the second region B, may be formed on the uppermost insulation layers 106. In example embodiments, the plurality of second portions of the etching mask pattern 114a may be arranged along the third direction, and each of the second portions of the etching mask pattern 114a may extend in the second direction. The second portions may be formed on portions of the first preliminary structure 110 for forming the second pad regions. The etching mask pattern 114a may include, e.g., a photoresist pattern.

Figure 8:
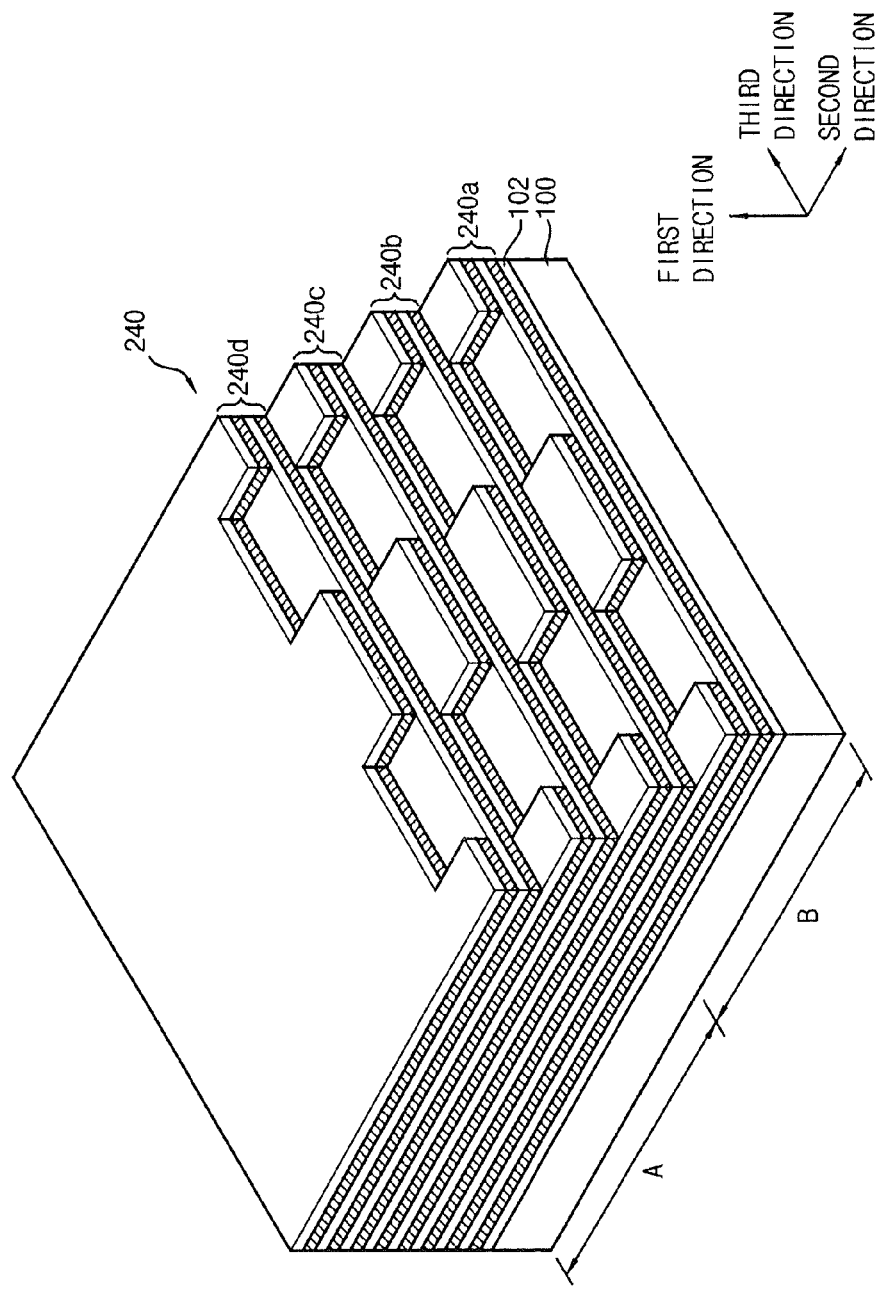

Referring to FIG. 8, end portions of upper insulation layers 106 in each of the steps 110a, 110b, 110c and 110d that are not covered by the etching mask pattern 114a, as well as corresponding end portions of upper sacrificial layers 104 in each of the steps 110a, 110b, 110c and 110d under the end portions of the upper insulation layers 106, may be etched using the etching mask pattern 114a to form a second preliminary step structure 240. Thus, in each of the steps 240a, 240b, 240c and 240d of the second preliminary step structure 240, a portion of a lower sacrificial layer 104 may be exposed by the upper sacrificial layer 104.

Figure 9:
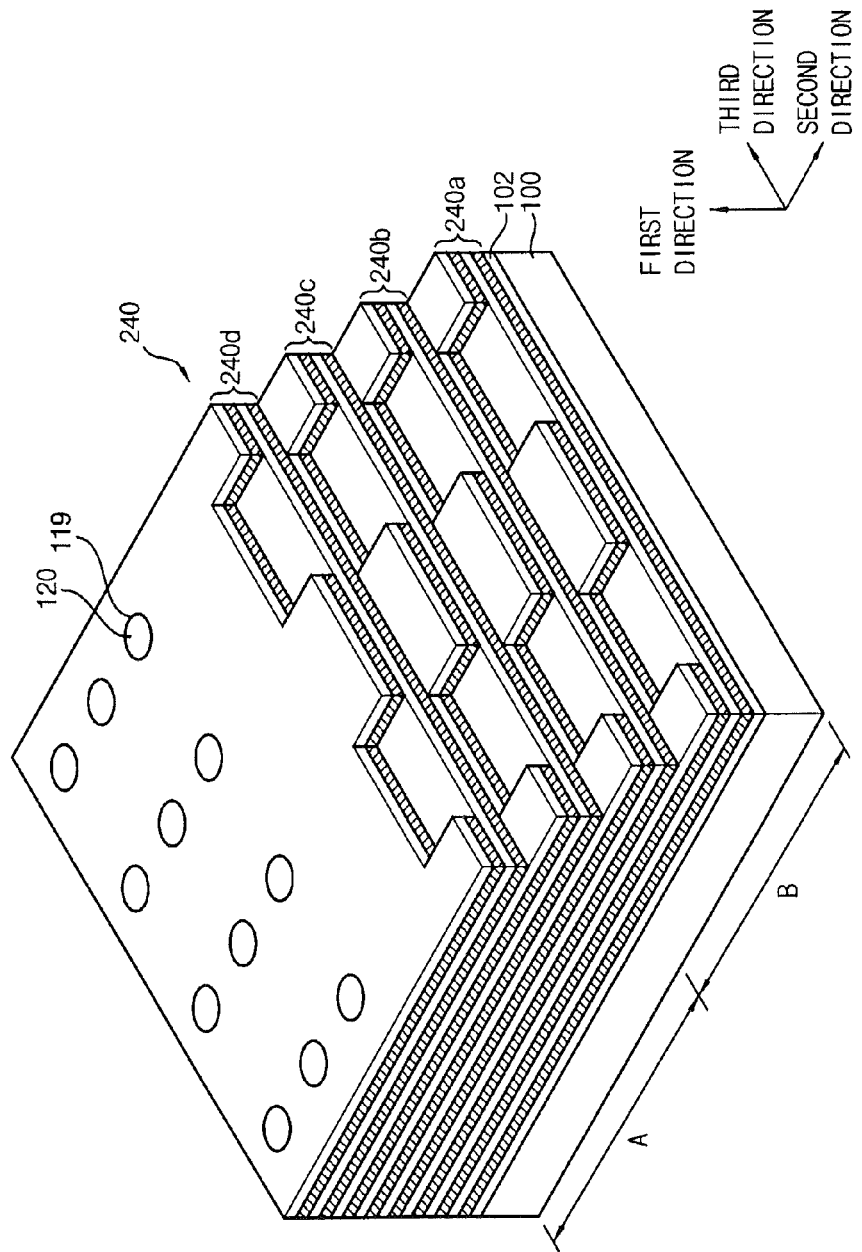

Referring to FIG. 9, a first insulating interlayer may be formed to cover the second preliminary step structure 240. A plurality of pillar structures 120 may be formed on the substrate 100 through the first insulating interlayer and the second step structure 240. Each of pillar structures 120 may include a channel pattern therein and may have various shapes.

Hereinafter, a method of forming the pillar structures 120 may be explained. A plurality of channel holes 119 exposing the upper surface of the substrate 100 may be formed through the first insulating interlayer, the insulation layers 106 and the sacrificial layers 104. The plurality of channel holes 119 may be arranged both in the second and third directions.

A first blocking layer, a charge storing layer, a tunnel insulation layer and a first channel layer may be sequentially formed on sidewalls of the channel holes 119, the exposed upper surface of the substrate 100 and the upper surface of the first insulating interlayer. The first blocking layer may be formed to include an oxide, e.g., silicon oxide. The charge storing layer may be formed to include a nitride, e.g., silicon nitride. The tunnel insulation layer may be formed to include an oxide, e.g., silicon oxide. The first channel layer may be formed to include, e.g., doped or undoped polysilicon, or amorphous silicon.

Portions of the first channel layer, the tunnel insulation layer, the charge storing layer and the first blocking layer on the exposed upper surface of the substrate 100 and the upper surface of the first insulating interlayer may be removed so that a first channel layer pattern, a tunnel insulation layer pattern, a charge storing layer pattern and a first blocking layer pattern may be formed on the sidewalls of the channel holes 119.

A second channel layer may be formed on the first channel layer pattern, the exposed upper surface of the substrate 100 and the upper surface of the first insulating interlayer, and a filling layer may be formed on the second channel layer to fill remaining portions of the channel holes 119. Upper portions of the filling layer and the second channel layer may be planarized to form a channel pattern including the first channel layer pattern and the second channel layer, and a filling layer pattern in each of the channel holes 119. Upper portions of the channel pattern and the filling layer pattern in each channel holes 119 may be removed to form a recess, and a conductive pattern may be formed in the recess. Through the processes described above, the pillar structures 120 may be formed.

Figure 10:
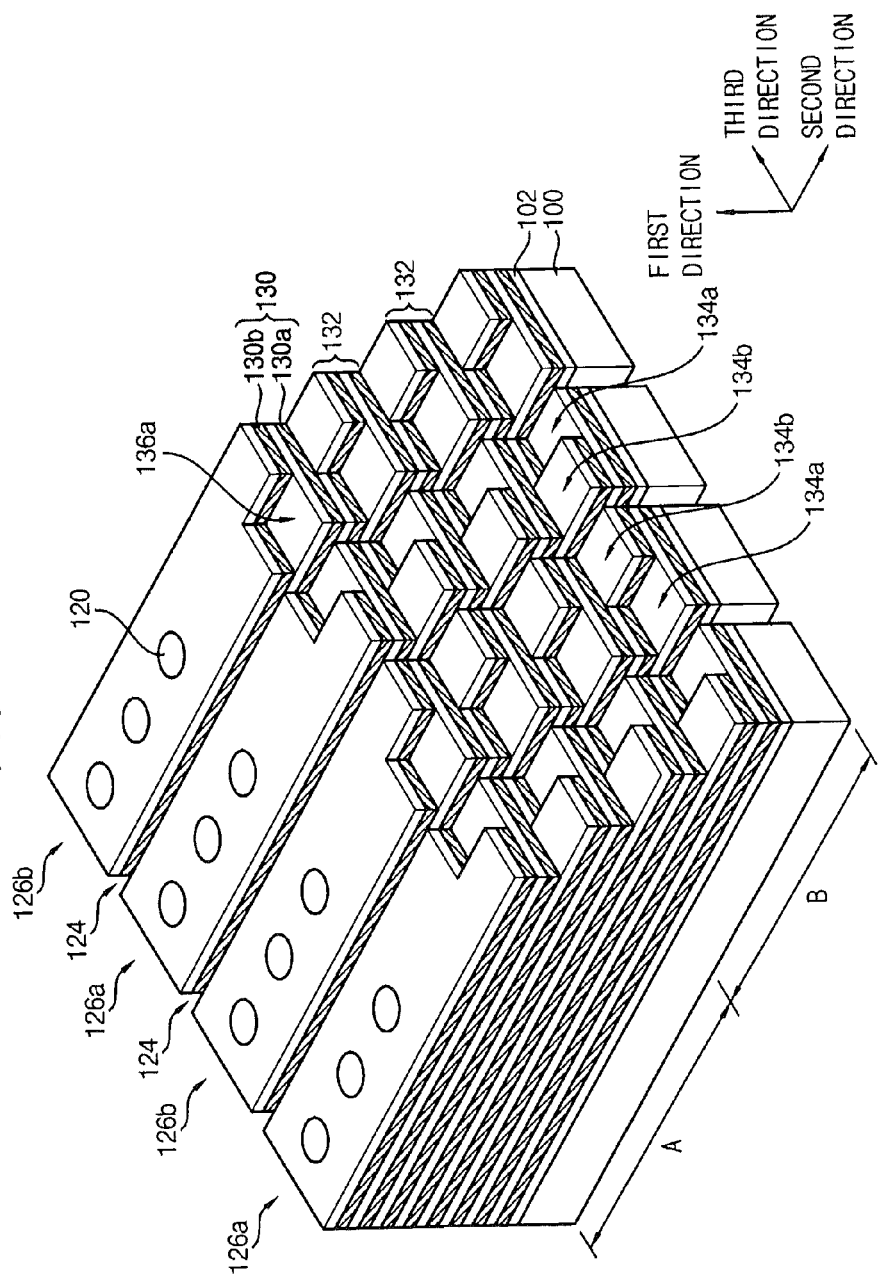

Referring to FIG. 10, a plurality of openings 124, each of which may extend in the second direction, may be formed through the first insulating interlayer and the second preliminary step structure 240 to expose the upper surface of the substrate 100. Thus, the second preliminary step structure 240 may be transformed into a plurality of third preliminary step structures, each of which may extend in the second direction.

The sacrificial layers 104 may be replaced with word lines 130 through a gate replacement process. By performing the gate replacement process, word line structures 126a and 126b, each of which may include a pad structure at an end portion thereof, may be formed.

The gate replacement process may be performed as follows. The sacrificial layers 104 exposed to the openings 124 may be removed to form gaps, each of which may expose sidewalls of the pillar structures 120.

A second blocking layer may be formed on the exposed sidewalls of the pillar structures 120 in the gaps. A barrier layer may be formed on the second blocking layer. A metal layer may be formed on the barrier layer to sufficiently fill the gaps.

In example embodiments, the second blocking layer may be formed to include a metal oxide having a dielectric constant greater than that of silicon nitride. Examples of the metal oxide may include aluminum oxide, hafnium oxide, lanthanum oxide, lanthanum aluminum oxide, lanthanum hafnium oxide, hafnium aluminum oxide, titanium oxide, tantalum oxide, zirconium oxide. Alternately, the second blocking layer may not be formed.

The barrier layer may be formed to include a metal nitride, e.g., titanium nitride, tantalum nitride, tantalum, tantalum nitride. These may be used alone or in a combination thereof. The barrier layer may be formed on the second blocking layer and inner walls of the gaps. Therefore, the barrier layer may not completely fill the gaps. The metal layer may be formed to include a metal having a low electrical resistance. Examples of the metal include tungsten.

While the portion of the metal layer in the gap is retained, a portion of the metal layer in the openings 124 may be removed. The removing process may include a wet etching process. Through the processes above, the sacrificial layers 104 may be replaced with conductive patterns including the barrier layer and the metal layer. The conductive patterns may serve as gate electrodes of cell transistors, i.e., word lines 130, or gate electrodes of selective transistors.

Each of the first and second word lines 130a and 130b in each step layer 132 including the word lines and the insulation layers 106 may include first and second pad regions 134a and 134b, respectively, at one end portions thereof in the second region B.

Referring to FIG. 3 again, insulation patterns may be formed to fill the openings 124 between the word line structures 126a and 126b. A second insulating interlayer may be further formed to cover the word line structures 126a and 126b and the insulation patterns.

First contact holes and second contact holes may be formed through the first and second insulating interlayers to expose the first pad regions 134a and the second pad regions 134b, respectively. The first and second contact holes exposing the first and second pad regions 134a and 134b in the same step layer 132 may be arranged in a straight line along the third direction. In example embodiments, central portions of the first and second pad regions 134a and 134b may be exposed by the first and second contact holes. First and second contact plugs 140a and 140b including a conductive material may be formed to fill the first and second contact holes, respectively.

Referring to FIGS. 1 and 2 again, first and second connecting patterns 142a and 142b, first and second pad patterns 144a and 144b, and first and second wiring lines 146a and 146b may be formed on the first and second contact plugs 140a and 140b.

The first and second connecting patterns 142a and 142b, the first and second pad patterns 144a and 144b, and the first and second wiring lines 146a and 146b may be formed by depositing a conductive layer and patterning the conductive layer.

Alternately, the first and second connecting patterns 142a and 142b, the first and second pad patterns 144a and 144b, and the first and second wiring lines 146a and 146b may be formed by a damascene method. Therefore, wiring structures may be formed.

An additional insulating interlayer may be further formed to cover the wiring structures. An upper contact plugs may be formed through the additional insulating interlayer to be electrically connected with the first and second wiring lines 146a and 146b. Further, upper conductive lines may be formed on the upper contact plugs. Each of the conductive lines may have a linear shape extending in the second direction.

According to the above-described processes, a highly integrated three-dimensional semiconductor device may be manufactured.

Figure 11:
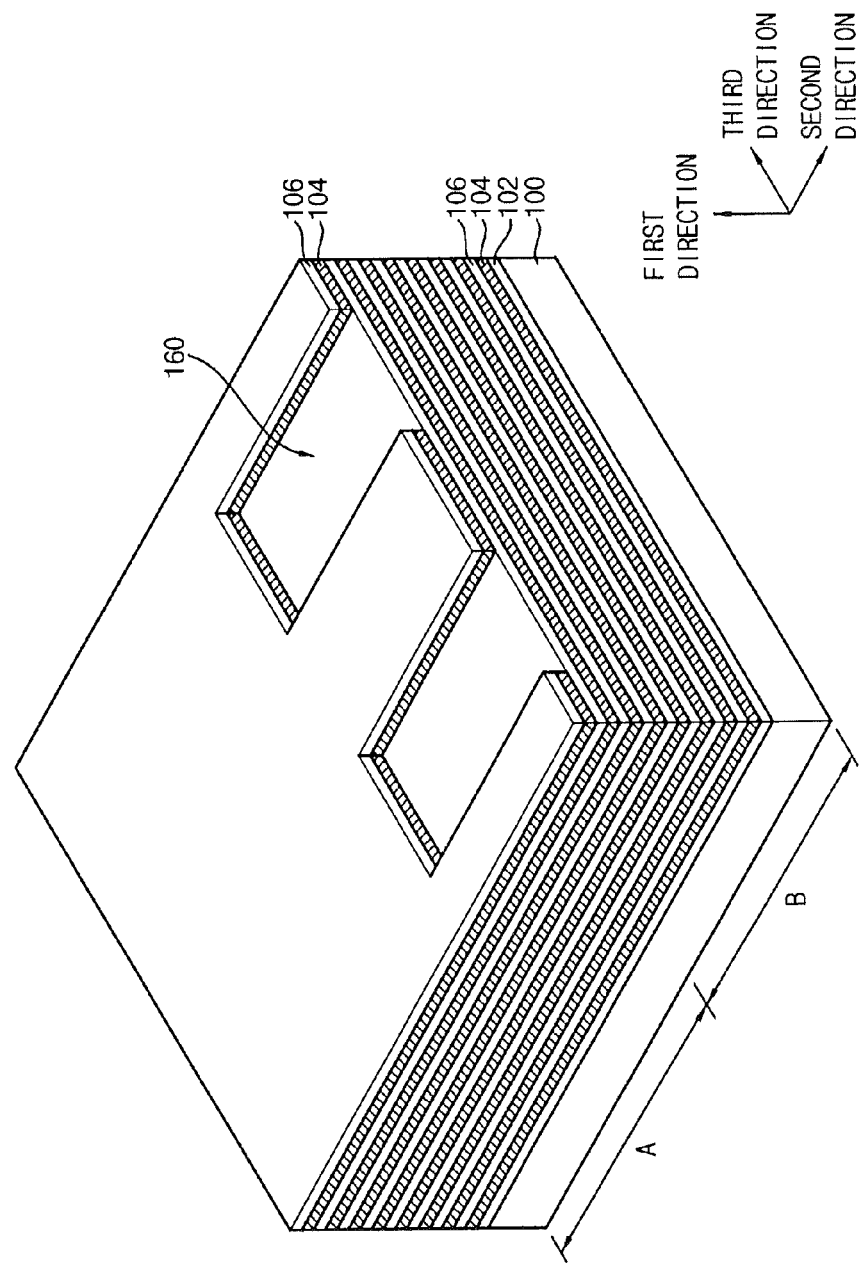
FIGS. 11 and 12 are perspective views illustrating intermediate structures provided in operations of manufacturing the three-dimensional semiconductor device in FIG. 1.
Figure 12:
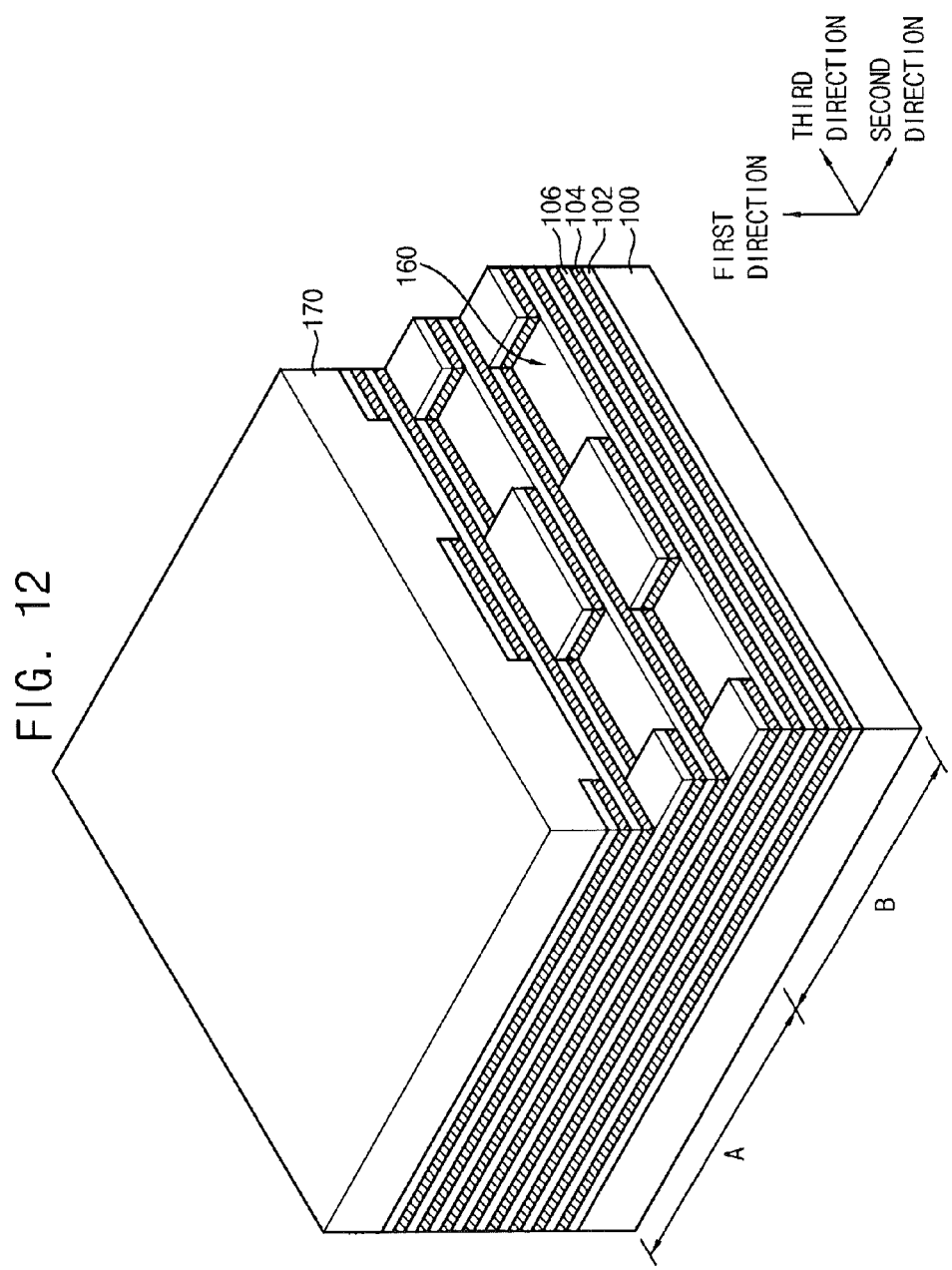

FIGS. 11 and 12 are perspective views illustrating intermediate structures provided in operations of manufacturing the three-dimensional semiconductor device in FIG. 1.

The structure illustrated in FIG. 4 may be formed by performing the same or similar processes explained referring to FIG. 4.

Referring to FIG. 11, an uppermost layer of the insulation layers 106, hereinafter "uppermost insulation layer", and an uppermost layer of the sacrificial layers 104, hereinafter "uppermost sacrificial layer", in the wiring area may be partially etched to form step portions 160. In other words, one uppermost insulation layer 106 and one sacrificial layer 104 may be etched. The step portions 160 may be areas corresponding to the first pad regions in the each of the step layers. The first pad regions in the pad structures adjacent each other along the third direction may be mirror images of each other.

Referring to FIGS. 12 and 8, the insulation layers 106 and the sacrificial layers 104 in a structure including the step portion 160 may be partially etched to form a second preliminary step structure 240 having a step shape in the end portion.

Hereinafter, an example of method of forming the second preliminary step structure 240 may be explained.

Referring to FIG. 12, a photoresist pattern may be formed on the structure including the step portions by forming a first photoresist layer and performing a first photo process. That is, a first end portion of the first photoresist layer in the second direction, which may be located in the second region B, may be removed to form a first photoresist pattern exposing a first end portion of the uppermost insulation layer 106 in the second direction. The exposed first end portion of the uppermost insulation layer 106, as well as corresponding first end portions of two sacrificial layers 104 and one insulation layer 106 under the exposed first end portion of the uppermost insulation layer 106, may be etched using the first photoresist pattern as an etching mask.

Then, a second end portion of the first photoresist pattern in the second direction, which may be also in the second region B, may be trimmed to form a second photoresist pattern 170 exposing a second end portion of the uppermost insulation layer 106. The exposed second end portion of the uppermost insulation layer 106, as well as corresponding second end portions of the two sacrificial layers 104 and the one insulation layer 106 under the exposed second end portion of the uppermost insulation layer 106, may be etched using the second photoresist pattern as an etching mask, and concurrently first end portions of other two insulation layers 106 and other two sacrificial layers 104, which have been under the first end portion of the uppermost insulation layer 106 and are exposed by the second photoresist pattern 170, may be etched.

Through the above-described processes, steps having step portions 160 and non-step portion portions may be formed. The non-step portions may protrude in the first direction compared with the step portions 160.

Referring to FIG. 8 again, a process including a photoresist trimming process and an etching process of the sacrificial layers 104 and the insulation layers 106 may be performed repeatedly. In other words, a process substantially the same as or similar to that illustrated with reference to FIG. 12 may be repeatedly performed using a third photoresist pattern, a fourth photoresist pattern, etc., to form a plurality of steps, e.g., four steps 240a, 240b, 240c and 240d. After forming the second preliminary step structure 240, the photoresist patterns may be removed.

Similar processes explained referring to FIGS. 9, 10 and FIGS. 1, 2 and 3 may be performed. When the openings 124 are formed, each of the openings 124 may pass the central portion of the step portions 160 and the non-step portions. Through performing the above-described processes, the three-dimensional semiconductor device illustrated in FIGS. 1 and 2 may be formed.

Figure 13:
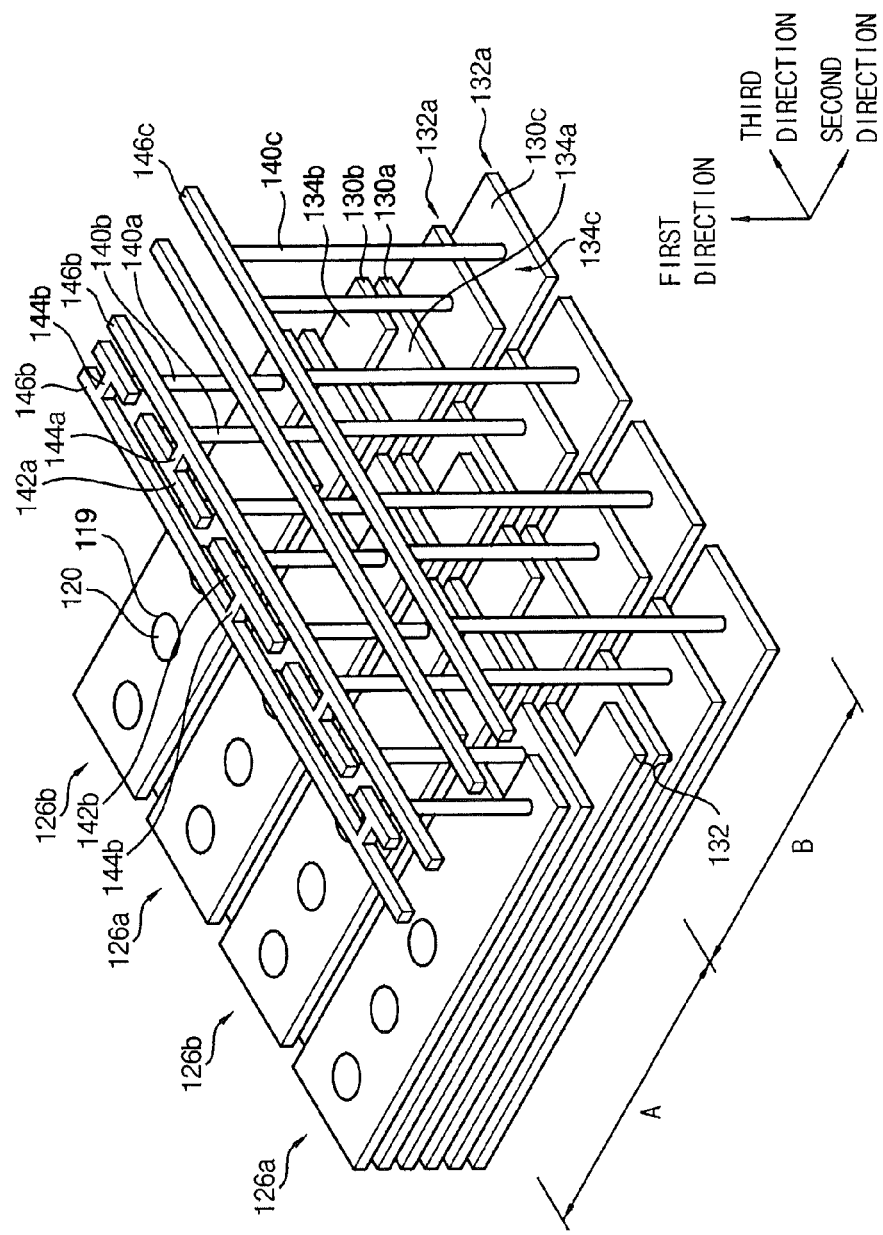
FIG. 13 is a perspective view illustrating a three-dimensional semiconductor device including wiring structures according to example embodiments of the present inventive concept.
Figure 14:
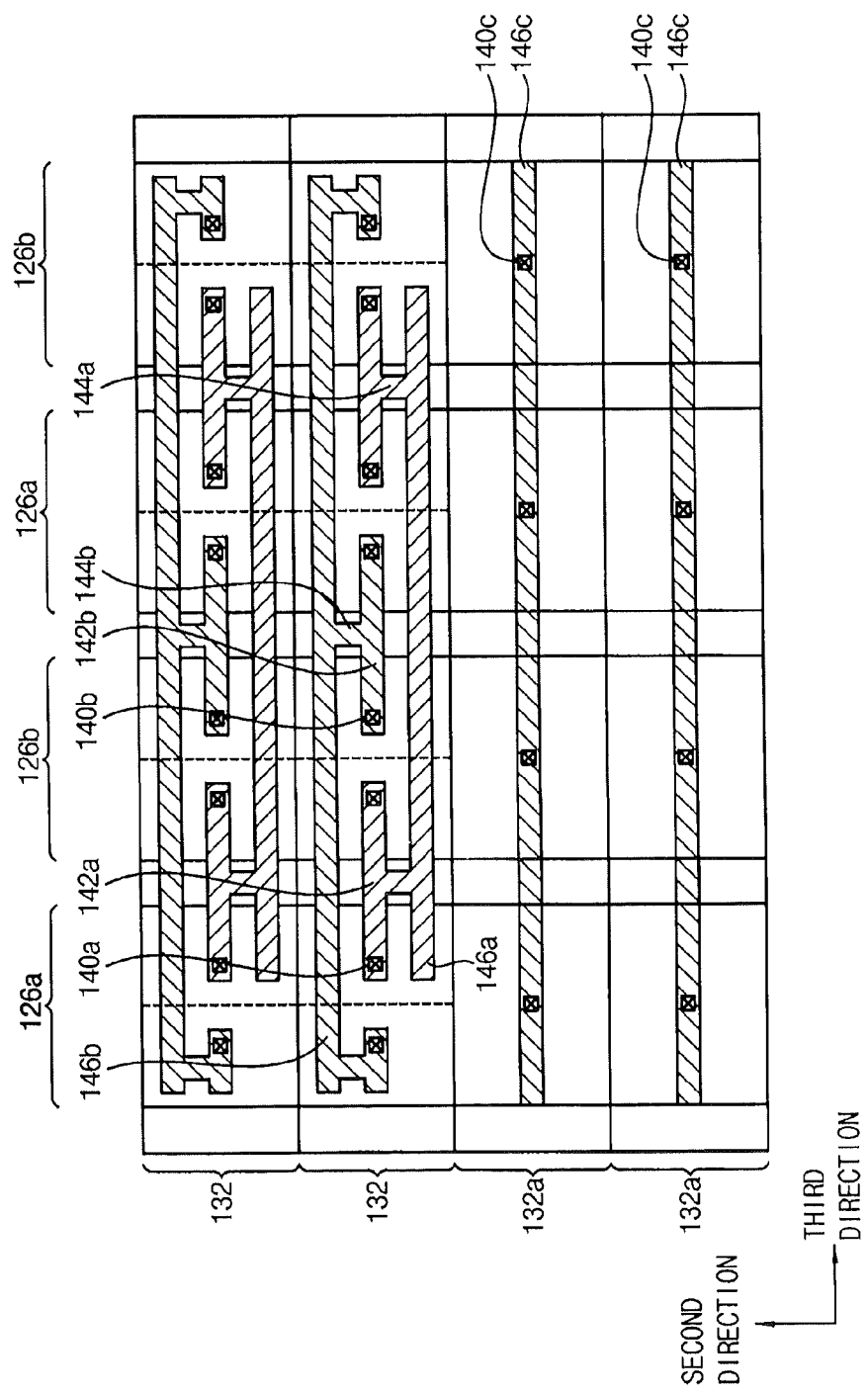
FIG. 14 is a plan view of a portion of the three-dimensional semiconductor device in FIG. 13.

FIG. 13 is a perspective view illustrating a three-dimensional semiconductor device including wiring structures according to example embodiments of the present inventive concept. FIG. 14 is a plan view of a portion of the three-dimensional semiconductor device in FIG. 13.

A wiring structure as illustrated in FIG. 13 may have the same or similar wiring structure as illustrated in FIG. 1 except for the shapes of some word lines and wirings.

Referring to FIGS. 13 and 14, a pad structure may be formed on a pad insulating layer in the substrate. The pad structure may have a step shape. In other words, the pad structure may include a plurality of step layers 132 and 132a. In the step layers 132 and 132a included in the pad structure, a lower step layer may extend longer than an upper step layer in the second direction.

At least one of step layers 132 and 132a included in the pad structure may have two word lines 130a and 130b stacked in the first direction that is substantially perpendicular to an upper surface of a substrate 100.

The step layers in first and second levels are referred to as first and second layers, respectively. Step layers in third and fourth levels are referred to as third and fourth layers, respectively.

In example embodiments, each of a first step layer and a second step layer 132a may include only one word line 130c. Further, each of a third step layer and a fourth step layer 132 may include two word lines 130a and 130b. Therefore, the number of the word lines 130a and 130b included in each step layer 132 and 132a in the pad structure may not be equal.

Since the first and second step layers 132a may include the word lines 130c, end portions of the word lines 130c may not have a dent. The word lines 130c included in the first and second step layers 132a are referred to as the third word lines 130c. Each of the third word lines 130c in the end portion may serve as a third pad region 134c for mounting a contact plug.

Each of the third and fourth step layers 132 may include two word lines 130a and 130b. In the third and fourth step layers 132, a lower word line is referred to as a first word line 130a and an upper word line is referred to as a second word line 130b. Each of the first and second word lines 130a and 130b included in the third and fourth step layers 132 may be the same as or similar to each of the word lines illustrated in FIG. 1.

End portions of each of the first word lines 130a may serve as first pad regions 134a for mounting first contact plugs 140a. End portions of each of the second word lines 130b may serve second pad regions 134b for mounting second contact plugs 140b.

Since a number of the word lines included in each of the step layers 132 and 132a may be different, thicknesses of the step layers 132 and 132a may be different. In example embodiments, a thickness of the first and second step layers 132a may be smaller than a thickness of the third and fourth step layers 132.

An insulating interlayer may be formed to cover the word line structures 126a and 126b including the pad structure.

First and second wiring structures may be formed on the insulating interlayer and in the insulating interlayer so as to be connected to each of the pad regions. The wiring structures may be formed only at one side of the pad structure or at both sides of the pad structure. The first wiring structure may be electrically coupled to the first and second word lines 130a and 130b in the third and fourth step layers 132, respectively. The first wiring structure may have the same or similar shape as the wiring structure explained above with reference to the FIGS. 1 and 2.

The first wiring structure may include the first contact plugs 140a, the first connecting patterns 142a, the first pad patterns 144a, the first wiring line 146a, the second contact plugs 140b, the second connecting pattern 142b, the second pad pattern 144b and the second wiring line 146b.

In order to simplify the figures, only one the first wiring structure connected with the uppermost of the first and second word lines 130a and 130b is illustrated. However, a plurality of first wiring structures having the same or similar shape may be connected to other step layers including the first and second word lines 130a and 130b.

A second wiring structure may be electrically coupled to the third word lines 130c in the first and second step layers 132a. The second wiring structure may include third contact plugs 140c and third wiring lines 146c. The third contact plugs 140c may contact the third word lines 130c through the insulating interlayers. The third wiring line 146c may extend in the third direction to contact upper surfaces of the third contact plugs 140c at substantially the same height.

According to example embodiments including the wiring structure described above, a highly integrated three-dimensional semiconductor device may be formed.

Figure 15:
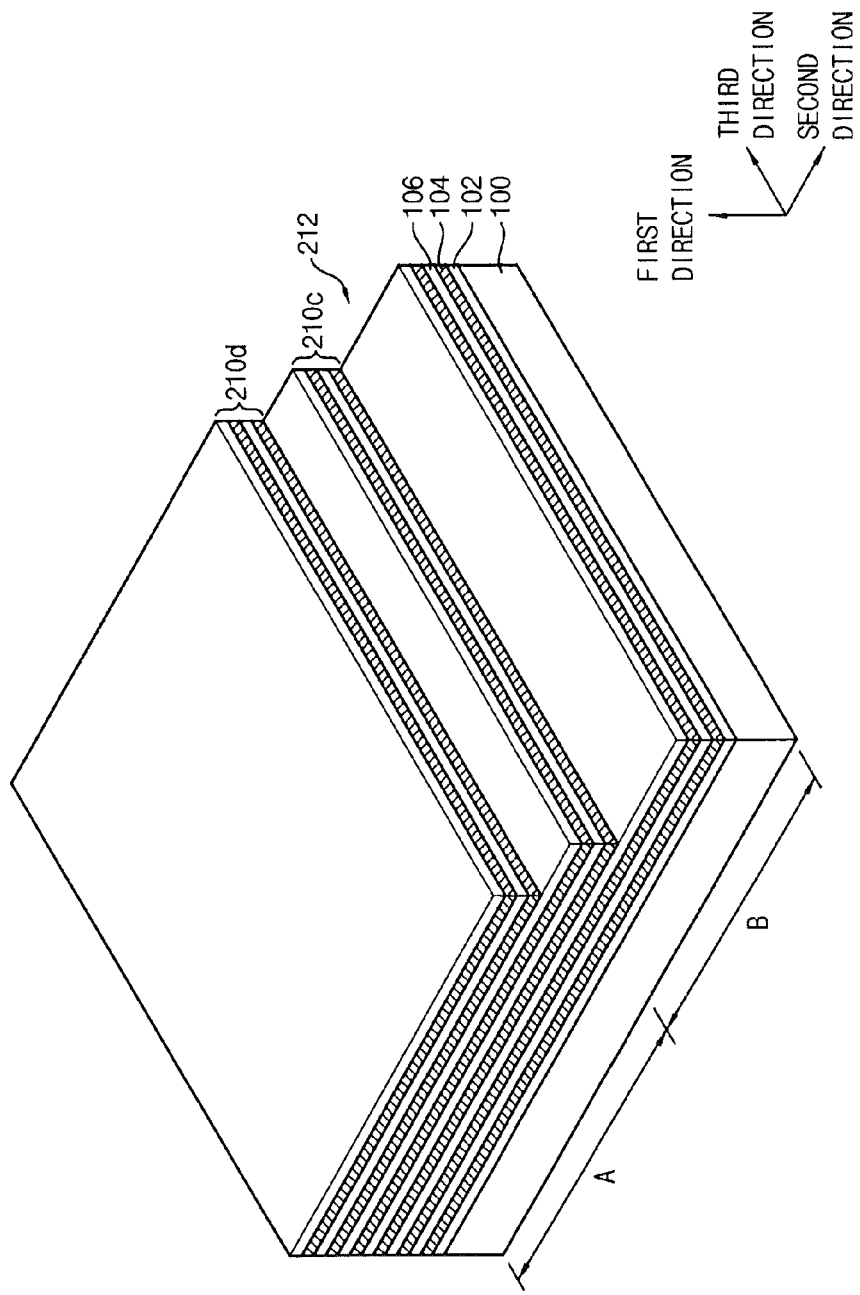
FIGS. 15 to 17 are perspective views illustrating intermediate structures provided in operations of manufacturing the three-dimensional semiconductor device in FIG. 13.
Figure 16:
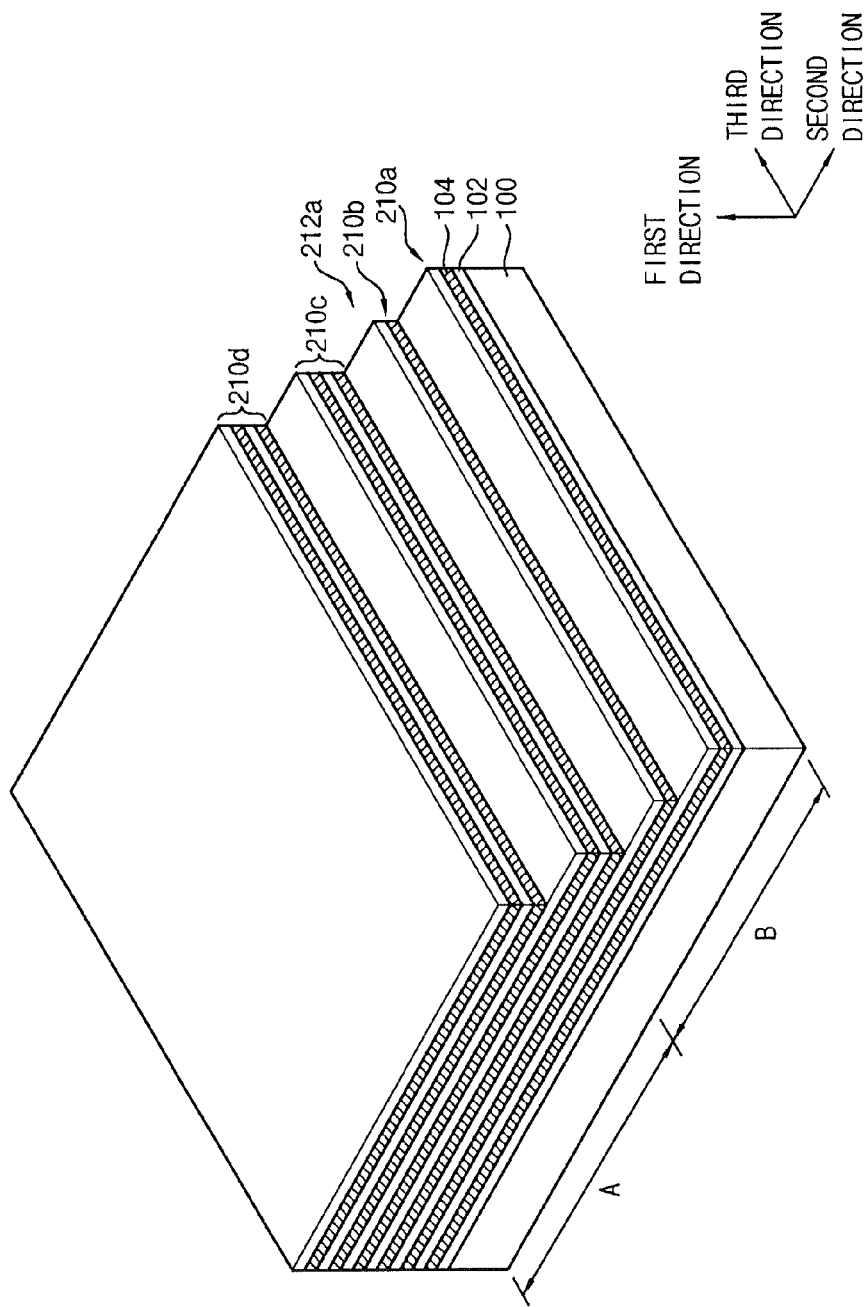
Figure 17:
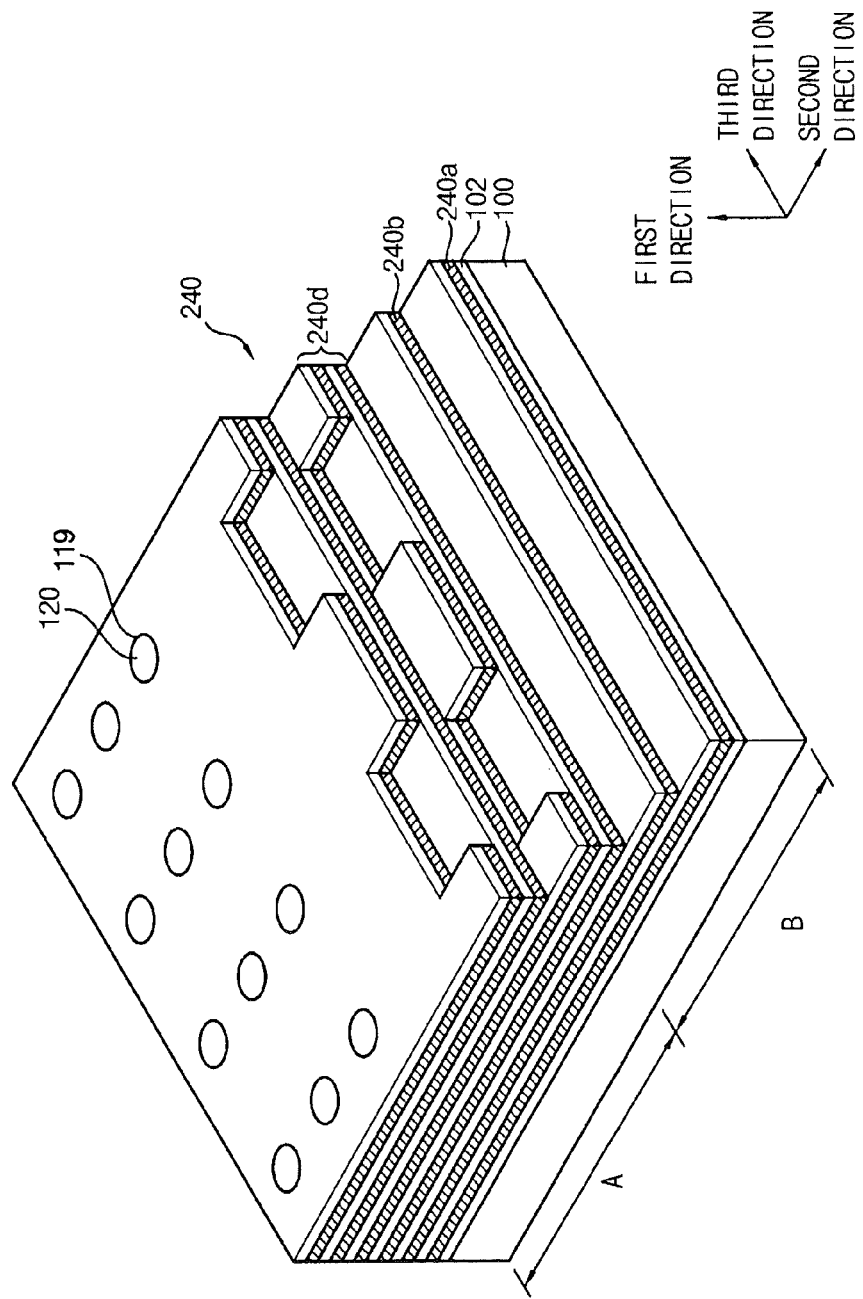

FIGS. 15 to 17 are perspective views illustrating intermediate structures provided in operations of manufacturing the three-dimensional semiconductor device in FIG. 13.

The structure illustrated in FIG. 4 may be formed by performing the same or similar process explained referring to FIG. 4.

Referring to FIG. 15, a first preliminary step structure 212 having a step shape at an end portion in the second direction, which may be located in the second region B, may be formed by etching the insulation layers 106 and the sacrificial layers 104. The first preliminary step structure 212 may be a mold pattern for forming the third and fourth step layers including two word lines. In this example embodiment, the first preliminary step structure 212 may be provided for forming two steps, 210c and 210d, in the pad structure.

For forming the first preliminary step structure 212, a first photoresist layer may be formed on an uppermost layer of the insulation layers 106, hereinafter "uppermost insulation layer", and a photo process may be performed to form a first photoresist pattern. That is, a first end portion of the first photoresist layer in the second direction, which may be located in the second region B, may be removed to form a first photoresist pattern exposing a first end portion of the uppermost insulation layer 106 in the second direction. The first end portion may be portions for forming the first and second step layers.

The exposed first end portion of the uppermost insulation layer 106 and corresponding first end portions of two sacrificial layers 104 and one insulation layer 106 under the exposed first end portion of the uppermost insulation layer 106 may be etched using the first photoresist pattern as an etching mask.

A second end portion of the first photoresist pattern in the second direction, which may be also in the second region B, may be trimmed to form a second photoresist pattern exposing a second end portion of the uppermost insulation layer 106. The exposed second end portion of the uppermost insulation layer 106 and corresponding second end portions of the two sacrificial layers 104 and the one insulation layer 106 under the exposed second end portion of the uppermost insulation layer 106 may be etched using the second photoresist pattern as an etching mask, and concurrently, first end portions of other two insulation layers 106 and other two sacrificial layers 104, which have been under the first end portion of the uppermost insulation layer 106 and are exposed by the second photoresist pattern, under the etched second end portions of the two sacrificial layers 104 and the one insulation layer 106 may be etched.

Referring to FIG. 16, a third photoresist pattern may be formed by forming a photoresist layer to cover the first preliminary step structure 212 and performing a photo process. The third photoresist pattern may serve as a mask for forming the lowest step layer. Therefore, the third photoresist pattern may expose portions for forming the lowest step layer.

The one sacrificial layer 104 may be etched by using the third photoresist pattern as an etching mask. Through the above-described process, a second preliminary pad structure 212a, including steps 210a and 210b, may be formed.

Referring to FIG. 17, an etching mask pattern may be formed so as to selectively cover portions of the second and third pad regions in the second preliminary pad structure 212a. In the other words, a portion of the first pad region may be exposed between the etching mask.

In example embodiments, the first pad regions in the pad structures adjacent each other along the third direction may be mirror images of each other.

The one sacrificial layer 104 exposed may be etched to form a third preliminary step structure 240 by using the etching mask pattern.

In this etching process, an upper sacrificial layer 104 of each of steps in the third preliminary structure 240 may be etched selectively. Therefore, each of lower sacrificial layers 104 in the third preliminary structure 240 may be exposed through the etched portions of the upper sacrificial layers 104.

An insulating interlayer may be formed to cover the third preliminary step structure 240. A plurality of pillar structures 120 may be formed on the substrate 100 through the first insulating interlayer and the third preliminary structure 240. The pillar structure 120 may include a channel pattern and may have various structures. Therefore, the pillar structure 120 may not be limited to a particular structure.

Then, a plurality of openings, each of which may extend in the second direction, may be formed through the first insulating interlayer and the third preliminary step structure 240 to expose the upper surface of the substrate 100. Thus, the third preliminary step structure 240 may be transformed into a plurality of fourth preliminary step structures, each of which may extend in the second direction.

Referring to FIG. 13 again, the sacrificial layers may be replaced by word lines through a gate replacement process. By performing the gate replacement process, the word line structures 126a and 126b may be formed.

An insulation pattern may be formed to fill the openings between the word line structures 126a and 126b. Further, an insulating interlayer may be formed to cover the word line structures 126a and 126b and the insulation pattern.

First to third contact holes may be formed through the insulating interlayers to expose the first to third pad regions, respectively. Then, first to third contact plugs 140a, 140b and 140c may be formed by filling the first to third contact holes with conductive material. The first to third contact plug 140a, 140b and 140c may be disposed in parallel to the third direction. In addition, the first to third contact plug 140a, 140b and 140c may be disposed on the central portions of the first to third pad regions, respectively.

First and second connecting patterns 142a and 142b, first and second pad patterns 144a and 144b and first and second wiring lines 146a and 146b may be formed on the first and second contact plugs 140a and 140b. The third wiring line 146c may be formed on the third contact plug 140c.

The first and second connecting patterns 142a and 142b, the first and second pad patterns 144a and 144b and the first to third wiring lines 146a, 146b, 146c may be formed by depositing a conductive layer and then patterning the conductive layer.

Alternately, the first and second connecting patterns 142a and 142b, the first and second pad patterns 144a and 144b and the first to third wiring lines 146a, 146b, 146c may be formed by a damascene method.

According to example embodiments, a highly integrated three-dimensional semiconductor device may be manufactured through simple processes.

Figure 18:
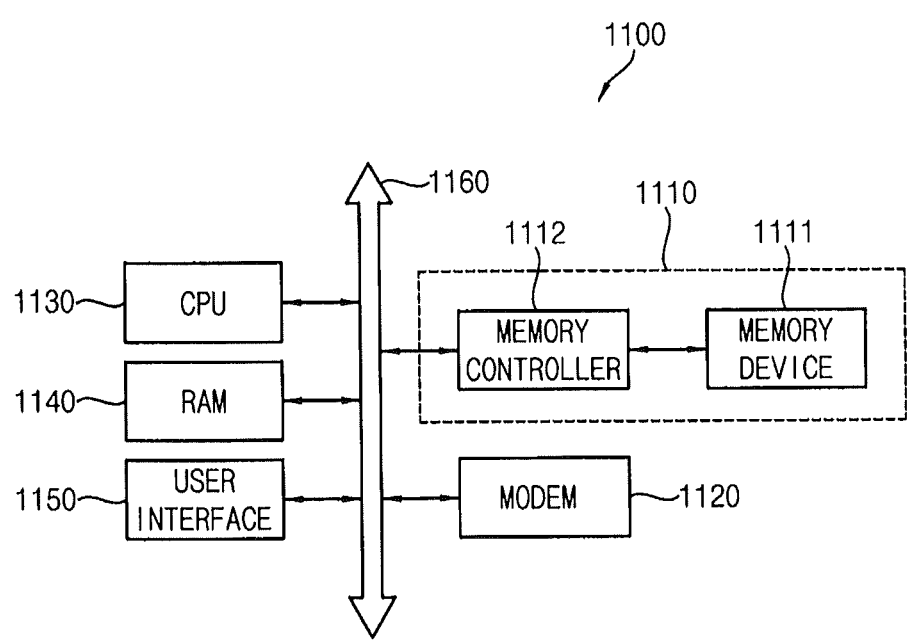
FIG. 18 is a block diagram illustrating an information processing system according to example embodiments of the present inventive concept.

FIG. 18 is a block diagram illustrating an information processing system according to example embodiments of the present inventive concept.

Referring to FIG. 18, an information processing system 1100 may include a three-dimensional semiconductor device including wiring structures according to example embodiments.

The information processing system 1100 may include a memory system 1110 and a modem 1120, a Central Processing Unit (CPU) 1130, a Random Access Memory (RAM) 1140 and a user interface 1150 electrically connected to a system bus 1160, respectively. The memory system 1110 may include a memory device 1111 and a memory controller 1112. In the memory system 1110, data processed by the CPU 1130 and data input from an exterior source may be stored. A three-dimensional semiconductor device according to example embodiments may be included in the memory system 1110, and a large sized data may be stored in the information processing system 1100.

The information processing system 1100 may be further provided with, for example, an application chipset, a camera image processor (CIS), a mobile DRAM, an input/output apparatus.

As described above, a highly integrated three-dimensional semiconductor device may be manufactured. Particularly, the three-dimensional semiconductor device may be manufactured by simple processes.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A wiring structure, comprising:
a first structure including first step layers, wherein each of the first step layers includes a first word line and a second word line stacked on the first word line in a first direction and extends in a second direction, the first step layers are spaced apart from each other in the first direction, the first direction is substantially perpendicular to an upper surface of a substrate, the second direction is substantially parallel to the upper surface of the substrate, and each of the second word lines includes a first dent at an end portion thereof in the second direction;
a second structure including second step layers and being disposed adjacent to the first structure in a third direction, wherein each of the second step layers includes a third word line and a fourth word line stacked on the third word line in the first direction and extends in the second direction, the second step layers are spaced apart from each other in the first direction, the third direction is substantially parallel to the upper surface of the substrate and is substantially perpendicular to the second direction, each of the fourth word lines includes a second dent at an end portion thereof in the second direction, and each of the second dents is a mirror image of one of the first dents about an axis extending between the first and second structures;
first contact plugs contacting respective upper surfaces of the first word lines exposed by the first dents and respective upper surfaces of the third word lines exposed by the second dents;
second contact plugs contacting respective upper surfaces of the second and fourth word lines;
a first connecting pattern connecting immediately adjacent ones of the first contact plugs, which are arranged along the third direction;
a first wiring line extending in the third direction, wherein the first wiring line is spaced apart from the first contact plugs and is electrically connected to the first connecting pattern; and
a second wiring line extending in the third direction, wherein the second wiring line is spaced apart from the second contact plugs and is electrically connected to at least one of the second contact plugs.

2. The wiring structure of claim 1, wherein:
each of the first and second step layers are stacked in the first direction at a plurality of heights from the upper surface of the substrate; and
a length of each of the first and second step layers in the second direction decreases as a height of the each of the first and second first step layers increases.

3. The wiring structure of claim 2, wherein:
the first wiring line is electrically connected with ones of the first contact plugs contacting the first and third word lines, which are at a first height from the upper surface of the substrate; and
the second wiring line is electrically connected with ones of the second contact plugs contacting the second and fourth word lines, which are at a second height from the upper surface of the substrate.

4. The wiring structure of claim 2, wherein:
ones of the first contact plugs contacting the first and third word lines, which are at a first height from the upper surface of the substrate, are disposed along the third direction; and
ones of the second contact plugs contacting the second and fourth word lines, which are at a second height from the upper surface of the substrate, are disposed along the third direction.

5. The wiring structure of claim 1, wherein:
the first structure is one of first structures and the second structure is one of second structures; and
the first and second structures are arranged in an alternating sequence in the third direction.

6. The wiring structure of claim 1, further comprising a first pad pattern connecting the first connecting pattern to the first wiring line.

7. The wiring structure of claim 1, wherein:
ones of the first contact plugs contacting the first and third word lines, which are at a first height from the upper surface of the substrate, are disposed along the third direction; and
ones of the second contact plugs contacting the second and fourth word lines, which are at a second height from the upper surface of the substrate, are disposed along the third direction.

8. The wiring structure of claim 1, wherein:
the first and the second contact plugs contact respective first and second pad regions;
the first pad regions are adjacent respective end portions of the first and third word lines in the second direction; and
the second pad regions are adjacent respective end portions of the second and fourth word lines in the second direction.

9. The wiring structure of claim 8, wherein the first and the second contact plugs contact central portions of respective the first and second pad regions.

10. The wiring structure of claim 1, wherein some of the first and second contact plugs are disposed between the first and second wiring lines.

11. A vertical integrated circuit device, comprising:
an upper word line extending in a longitudinal direction, wherein the upper word line includes a recessed portion that extends for only a portion of the upper word line in a transverse direction that is substantially perpendicular to the longitudinal direction;
a lower word line extending in the longitudinal direction, wherein the upper and lower word lines are at least partially stacked in a vertical direction that is substantially perpendicular to both the longitudinal direction and the transverse direction and the lower word line includes a wiring area exposed by the recessed portion of the upper word line;
an upper contact plug contacting the upper word line and extending in the vertical direction; and
a lower contact plug contacting the wiring area and extending in the vertical direction.

12. The vertical integrated circuit device of claim 11, wherein the lower contact plug only contacts the lower word line in the wiring area.

13. The vertical integrated circuit device of claim 11, wherein the upper contact plug and the lower contact plug are arranged in a straight line along the transverse direction.

14. The vertical integrated circuit device of claim 11, further comprising:
a first wiring line and a second wiring line electrically connected to the upper contact plug and the lower contact plug, respectively, wherein the first and second wiring lines are at a substantially equal level in the vertical direction.

15. The vertical integrated circuit device of claim 14, wherein:
the first and second wiring lines extend parallel to each other;
the upper contact plug and the lower contact plug are disposed between the first and second wiring lines in the longitudinal direction; and
the device further comprises a first connecting pattern contacting both the upper contact plug and the first wiring line and a second connecting pattern contacting both the lower contact plug and the second wiring line.

16. The vertical integrated circuit device of claim 11, wherein:
the upper word line comprises a first upper word line, the recessed portion comprises a first recessed portion, the lower word line comprises a first lower word line, and the wiring area comprises a first wiring area, wherein the first upper word line and the first lower word line comprise a first stack;
the upper contact plug comprises a first upper contact plug and the lower contact plug comprises a first lower contact plug; and
the device further comprises a second stack spaced apart from the first stack in the transverse direction, the second stack including,
a second upper word line extending in the longitudinal direction, wherein the second upper word line includes a second recessed portion that extends for only a portion of the second upper word line in the transverse direction,
a second lower word line extending in the longitudinal direction, wherein the second upper word line and the second lower word line are at least partially stacked in the vertical direction, and the second lower word line includes a second wiring area exposed by the second recessed portion of the second upper word line,
a second upper contact plug contacting the second upper word line and extending in the vertical direction, and
a second lower contact plug contacting the second wiring area and extending in the vertical direction, wherein the first and second upper contact plugs and the first and second lower contact plugs are arranged in a straight line along the transverse direction.

17. The vertical integrated circuit device of claim 16, wherein:
upper surfaces of the first and second upper contact plugs and the first and second lower contact plugs are at a first level in the vertical direction; and
the device further comprises a first wiring line electrically connected to both the first and second upper contact plugs and a second wiring line electrically connected to both the first and second lower contact plugs, wherein the first and second wiring lines are at a second level in the vertical direction.

18. The vertical integrated circuit device of claim 11,
the upper word line comprises a first upper word line, the recessed portion comprises a first recessed portion, the lower word line comprises a first lower word line, and the wiring area comprises a first wiring area, wherein the first upper word line and the first lower word line comprise a first stack;
the upper contact plug comprises a first upper contact plug and the lower contact plug comprises a first lower contact plug; and
the device further comprises a second stack spaced apart from the first stack in the transverse direction, the second stack including,
a second upper word line extending in the longitudinal direction, wherein the second upper word line includes a second recessed portion that extends for only a portion of the second upper word line in the transverse direction and is a mirror image of the first recessed portion about an axis extending between the first stack and the second stack,
a second lower word line extending in the longitudinal direction, wherein the second upper word line and the second lower word line are at least partially stacked in the vertical direction, and the second lower word line includes a second wiring area exposed by the second recessed portion of the second upper word line,
a second upper contact plug contacting the second upper word line and extending in the vertical direction, and
a second lower contact plug contacting the second wiring area and extending in the vertical direction.

19. The vertical integrated circuit device of claim 18, wherein the first and second upper contact plugs and the first and second lower contact plugs are arranged in a straight line along the transverse direction.

20. The vertical integrated circuit device of claim 18, further comprising:
a first wiring line electrically connected to both the first and second upper contact plugs and a second wiring line electrically connected to both the first and second lower contact plugs, wherein the first and second wiring lines extend parallel to each other and the first and second upper contact plugs and the first and second lower contact plugs are disposed between the first and second wiring lines in the longitudinal direction;
a connecting pattern between the first and second wiring lines, wherein the connecting pattern contacts the first wiring line and includes a portion extending parallel to the first and second wiring lines to contact both the first and second upper contact plugs.

* * * * *